US008795767B2

(12) United States Patent
Pfenninger et al.

(10) Patent No.: US 8,795,767 B2
(45) Date of Patent: Aug. 5, 2014

(54) LUMINESCENT MATERIALS THAT EMIT LIGHT IN THE VISIBLE RANGE OR THE NEAR INFRARED RANGE

(75) Inventors: William M. Pfenninger, Fremont, CA (US); Nemanja Vockic, San Jose, CA (US); John Kenney, Palo Alto, CA (US)

(73) Assignee: OMNIPV, Inc., Belmont, CA (US)

( * ) Notice: Subject to any disclaimer, the term of this patent is extended or adjusted under 35 U.S.C. 154(b) by 587 days.

(21) Appl. No.: 12/611,062

(22) Filed: Nov. 2, 2009

(65) Prior Publication Data

US 2010/0055350 A1    Mar. 4, 2010

Related U.S. Application Data

(63) Continuation of application No. 11/689,381, filed on Mar. 21, 2007, now Pat. No. 7,641,815.

(60) Provisional application No. 60/784,863, filed on Mar. 21, 2006.

(51) Int. Cl.
    B05D 3/02      (2006.01)
    C23C 14/30     (2006.01)
    C23C 14/58     (2006.01)
    C09K 11/66     (2006.01)
    C09K 11/61     (2006.01)
    C09K 11/72     (2006.01)
    C23C 14/06     (2006.01)
    C23C 14/16     (2006.01)
    C23C 14/24     (2006.01)

(52) U.S. Cl.
    CPC ............ C09K 11/665 (2013.01); C09K 11/613 (2013.01); C09K 11/616 (2013.01); C09K 11/668 (2013.01); C09K 11/72 (2013.01); C23C 14/0694 (2013.01); C23C 14/16 (2013.01); C23C 14/24 (2013.01); C23C 14/30 (2013.01); C23C 14/5806 (2013.01)
    USPC ............ 427/226; 427/566; 427/567; 427/64; 427/69; 427/255.15; 427/255.19; 427/372.2; 427/419.1; 427/419.2; 427/419.7

(58) Field of Classification Search
    None
    See application file for complete search history.

(56) References Cited

U.S. PATENT DOCUMENTS 2,196,077 A    4/1940  Marrow et al.
3,655,332 A    4/1972  Smith, Jr.
(Continued)

FOREIGN PATENT DOCUMENTS

DE    2952436      7/1981
DE    10148161     4/2003
(Continued)

OTHER PUBLICATIONS

Yamada et al., "Structural Phase Transitions of the polymorphs of CsSnI3 by Means of Rietveld Analysis of the X-Ray Diffraction"; Chemistry Letters, the Chemical Society of Japan, p. 801-804, 1991 (no month).*

(Continued)

Primary Examiner — Marianne L Padgett
(74) Attorney, Agent, or Firm — Foley & Lardner LLP; Cliff Z. Liu

(57) ABSTRACT

Luminescent materials and the use of such materials in anti-counterfeiting, inventory, photovoltaic, and other applications are described herein. In one embodiment, a method of forming a luminescent material includes: (1) providing a source of A and X, wherein A is selected from at least one of elements of Group 1, and X is selected from at least one of elements of Group 17; (2) providing a source of B, wherein B is selected from at least one of elements of Group 14; (3) subjecting the source of A and X and the source of B to vacuum deposition to form a set of films adjacent to a substrate; and (4) heating the set of films to a temperature in the range of 120° C. to 350° C. to form a luminescent material adjacent to the substrate, wherein the luminescent material includes A, B, and X.

10 Claims, 15 Drawing Sheets

(56) References Cited

U.S. PATENT DOCUMENTS

| | | | |
|---|---|---|---|
| 4,054,645 A | 10/1977 | Hill et al. | |
| 4,076,794 A | 2/1978 | Smith | |
| 4,769,549 A * | 9/1988 | Tsuchino et al. | 250/484.4 |
| 4,803,366 A | 2/1989 | Vieux et al. | |
| 4,835,711 A | 5/1989 | Hutchins et al. | |
| 5,318,764 A | 6/1994 | Meshri et al. | |
| 5,366,896 A | 11/1994 | Margrey et al. | |
| 5,455,008 A | 10/1995 | Earley et al. | |
| 5,721,634 A | 2/1998 | Rosker et al. | |
| 5,736,069 A * | 4/1998 | Willems et al. | 252/301.4 H |
| 6,228,286 B1 | 5/2001 | Leblans et al. | |
| 6,880,746 B2 | 4/2005 | Seseke-Koyro et al. | |
| 7,464,185 B2 | 12/2008 | Sambandam | |
| 7,641,815 B2 * | 1/2010 | Varadarajan et al. | 252/301.4 H |
| 8,529,797 B2 * | 9/2013 | Shum | 252/501.1 |
| 2003/0042429 A1 * | 3/2003 | Isoda | 250/484.4 |
| 2003/0047697 A1 * | 3/2003 | Iwabuchi et al. | 250/584 |
| 2003/0102099 A1 | 6/2003 | Yadav et al. | |
| 2003/0104121 A1 * | 6/2003 | Leblans et al. | 427/70 |
| 2003/0189401 A1 | 10/2003 | Kido et al. | |
| 2004/0065403 A1 | 4/2004 | Hattori et al. | |
| 2005/0107870 A1 | 5/2005 | Wang et al. | |
| 2005/0181119 A1 * | 8/2005 | Tahon et al. | 427/65 |
| 2005/0285041 A1 | 12/2005 | Srivastava et al. | |
| 2006/0169998 A1 | 8/2006 | Radkov et al. | |
| 2007/0205712 A1 | 9/2007 | Radkov et al. | |
| 2008/0014463 A1 | 1/2008 | Varadarajan et al. | |
| 2008/0038494 A1 | 2/2008 | Midgley et al. | |
| 2010/0055350 A1 | 3/2010 | Pfenninger et al. | |
| 2011/0180757 A1 * | 7/2011 | Vockic et al. | 252/301.4 F |
| 2012/0305918 A1 * | 12/2012 | Shum | 257/49 |
| 2013/0139872 A1 * | 6/2013 | Shum et al. | 136/252 |
| 2013/0214205 A1 * | 8/2013 | Vockic et al. | 252/301.4 S |
| 2013/0217170 A1 * | 8/2013 | Vockic et al. | 438/69 |
| 2013/0233377 A1 * | 9/2013 | Kanatzidis et al. | 136/252 |
| 2013/0320836 A1 * | 12/2013 | Kanatzidis et al. | 313/483 |

FOREIGN PATENT DOCUMENTS

| | | | |
|---|---|---|---|
| EP | 0751200 | 1/1997 | |
| EP | 1113458 A1 * | 7/2001 | G21K 4/00 |
| EP | 1276117 A2 * | 1/2003 | G21K 4/00 |
| JP | 08-102293 A | 4/1996 | |
| WO | WO 98/52047 A1 | 11/1998 | |
| WO | WO 2007/109734 | 9/2007 | |

OTHER PUBLICATIONS

Ultradots, Inc. PCT/US07/064534 filed Mar. 21, 2007. Applicant: Ultradots, Inc. Int'l Search Report/Written Opinion dated Jan. 16, 2008.

European Appln. No. 07759029.7 Examination Report dated Oct. 12, 2011.

European Appln. No. 07759029.7 Examination Report dated Jul. 20, 2012.

Notification of First Office Action received for Chinese Appln. No. 200780017078.2 dated Aug. 1, 2011.

Caricato. "Pulsed laser deposition of Pr3 +-doped chalcogenide thin films for optical applications." Proc. SPIE, 5121:18 (Nov. 2003) pp. 325-336.

Ultradots, Inc. EP Supplementary Search Report. Appln. No. 07759029.7 (Mar. 23, 2010).

Clark et al., Luminescence and electrical conductivity of CsSnBr3, and related phases; Science Direct *J. Physics & Chemi. of Solids*, vol. 42, 3:133-135 (1981).

Voloshinovskii, et al., Luminescence and Structural Transformations of CsSnC13 Crystals. *J. Applied Spectroscopy*, vol. 60, Nos. 3-4 (1994), pp. 226-228.

Abstract, "Jahn-Teller distortion in the excited state of telluride (IV) in dicesium metal (M) hexachloride (Cs2MC16 M=zirconium,tin))." *Chem. Pysic Lett*. 144:5-6, pp. 460-462 (1988).

Mauersberger et al. "Structure of Caesium Triiodostannate(II)" *Acta Cryst.*. B36, pp. 683-684 (1980).

Scaife et al. "Crystal Preparation and Properties of Cesium Tin(II) Trihalides" *Journal of Solid State Chemistry*, 9, pp. 308-314 (1974).

Donaldson et al. "The Mössbauer Effect in Tin(II) Compounds. Part XIII. Data for the Products from Molten Caesium-Tin(II)-Halide Systems" *J. C. S. Dalton* pp. 666-669 (1973).

Chabot et al. "Ab initio study of the electronic and structural properties of CsSnI3 perovskite" U. Montreal 6 pages (2003).

Jacobs, Alkali halide crystals containing impurity ions with the ns2 ground-state electronic configuration. *J. Phys. Chem. Solids* vol. 52, No. 1, pp. 35-67 (1991).

Parry et al. "The Electronic Structure of CsSnBr3 and Related Trihalides; Studies Using XPS and Band Theory" *J. Solid State Chemistry* 28, pp. 401-408 (1979).

Suib et al. "Gel growth of single crystals of some rubidium and cesium tin halides" *J. Crystal Growth* 48, pp. 155-160 (1980).

Yamada et al. "Structural Phase Transitions of the Polymorphs of CsSnI3 by Means of Rietveld Analysis of the X-Ray Diffraction" *Chemistry Letters*, The Chemical Society of Japan, pp. 801-804 (1991).

Yamada et al. "Structure and Bonding of Two Modifications of CsSnI3 by Means of Powder X-Ray Diffraction, 1271 NQR, and DTA" *Chem. Letters*, Chem. Society of Japan, pp. 1325-1328 (1989).

Notification of Second Office Action. Chinese Appln. No. 200780017078.2 dated Aug. 2, 2012.

Babudri, F. et al., "Synthesis of Poly(arylenevinylene)s with Fluorinated Vinylene Units", European Journal of Organic Chemistry, 2008, pp. 1977-1982, Wiley-VCH Verlag GmbH & Co. KGaA, 69451 Weinheim, Germany.

Losurdo, M. et al., "Impact of fluorinated vinylene units on supramolecular organization and optical properties of poly(p-phenylenedifluorovinylene) thin films as a class of blue band gap conjugated polymers", Polymer, 2008, 49:4133-4140, online Jul. 22, 2008.

Shum et al., Synthesis and characterization of CsSnI3 thin films, Applied Physics Letter 96: 221903 (2010), online Jun. 2, 2010.

Yamada, K., et al., "127 I-NQR, 119Sn Mossbauer Effect, and Electrical Conductivity of MSnI3 (M=K, NH4, Rb, Cs and CH3NH3)*," Z. Naturfrosch. 1990, vol. 45a, pp. 307-312.

European Communication pursuant to Article 94(3) EPC in European Application No. 07 759 029.7 dated Jul. 12, 2012.

PCT/US2010/058669. Written Opinion dated Aug. 17, 2011.

U.S. Appl. No. 12/958,825. Office Action dated Aug. 24, 2012.

Final Office Action in U.S. Appl. No. 13/855,569 dated Jan. 2, 2014.

Non-Final Office Action in U.S. Appl. No. 13/855,561 dated Oct. 2, 2013.

Non-Final Office Action in U.S. Appl. No. 13/855,569 dated Aug. 15, 2013.

Notice of Allowance in U.S. Appl. No. 13/855,561 dated Jan. 14, 2014.

Miller, et al., "Study of the Heterocomplexes in the Vapor of the Na—Sn—Br—I System and Their Relevance for Metal Halide Lamps", J. Electrochem Soc., vol. 141, No. 10, pp. 2774-2778, (1994), October.

\* cited by examiner

LUMINESCENT MATERIALS THAT EMIT LIGHT IN THE VISIBLE RANGE OR THE NEAR INFRARED RANGE

CROSS-REFERENCE TO RELATED APPLICATIONS

This application is a continuation of U.S. patent application Ser. No. 11/689,381, filed on Mar. 21, 2007, now U.S. Pat. No. 7,641,815 which claims the benefit of U.S. Provisional Application Ser. No. 60/784,863, filed on Mar. 21, 2006, the disclosures of which are incorporated herein by reference in their entirety.

FIELD OF THE INVENTION

The invention relates generally to luminescent materials. More particularly, the invention relates to luminescent materials that emit light in the visible range or the near infrared range and the use of such materials in anti-counterfeiting, inventory, photovoltaic, and other applications.

BACKGROUND OF THE INVENTION

An object to be authenticated or identified is sometimes provided with a specific marking, which can be part of the object itself or can be coupled to the object. For example, a commonly used marking is a bar code, which includes a linear array of elements that are either printed directly on an object or on labels that are coupled to the object. These elements typically include bars and spaces, with bars of varying widths representing strings of binary ones, and spaces of varying widths representing strings of binary zeros. While bar codes are useful for tracking locations or identities of objects, these markings can be readily reproduced and, thus, have limited effectiveness in terms of preventing counterfeiting.

It is against this background that a need arose to develop the luminescent materials described herein.

SUMMARY OF THE INVENTION

In one aspect, the invention relates to methods of forming a luminescent material. In one embodiment, a method includes: (1) providing a source of A and X, wherein A is selected from at least one of elements of Group 1, and X is selected from at least one of elements of Group 17; (2) providing a source of B, wherein B is selected from at least one of elements of Group 14; (3) subjecting the source of A and X and the source of B to vacuum deposition to form a set of films adjacent to a substrate; and (4) heating the set of films to a temperature in the range of 120° C. to 350° C. to form a luminescent material adjacent to the substrate, wherein the luminescent material includes A, B, and X.

In another embodiment, a method includes: (1) providing a first compound having the formula: AX, wherein A is cesium, and X is selected from at least one of chlorine, bromine, and iodine; (2) providing a second compound having the formula: $BY_2$, wherein B is tin, and Y is selected from at least one of chlorine, bromine, and iodine; (3) depositing the first compound and the second compound on a substrate to form a set of films adjacent to the substrate; and (4) heating the set of films to a temperature sufficient to react the first compound and the second compound to form a luminescent material.

Luminescent materials according to various embodiments of the invention can exhibit a number of desirable characteristics. In some embodiments, the luminescent materials can exhibit photoluminescence with a high quantum efficiency, with a narrow spectral width, and with a peak emission wavelength located within a desirable range of wavelengths, such as the visible range or the near infrared range. Also, these photoluminescent characteristics can sometimes be relatively insensitive over a wide range of excitation wavelengths. The luminescent materials can have other desirable characteristics, such as relating to their band gap energies and electrical conductivities. Advantageously, the luminescent materials can be readily processed for use in anti-counterfeiting, inventory, photovoltaic, and other applications. For example, the luminescent materials can be used to form security markings that are difficult to reproduce and, thus, can be advantageously used in anti-counterfeiting applications. As another example, the luminescent materials can be used to form identification markings and, thus, can be advantageously used in inventory applications.

Other aspects and embodiments of the invention are also contemplated. The foregoing summary and the following detailed description are not meant to restrict the invention to any particular embodiment but are merely meant to describe various embodiments of the invention.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Definitions

Figure 1:
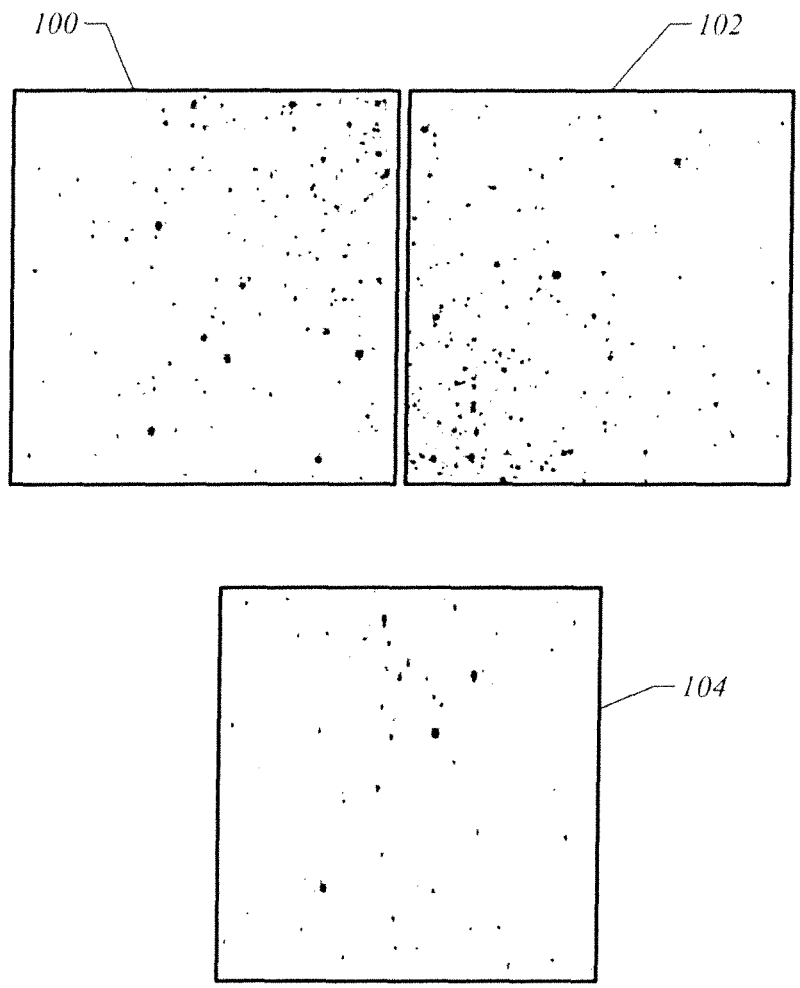
FIG. 1 provides line drawings replicating images that can be obtained by irradiating random arrays of nanoparticles, according to an embodiment of the invention.

The following definitions apply to some of the elements described with regard to some embodiments of the invention. These definitions may likewise be expanded upon herein.

As used herein, the singular terms "a," "an," and "the" include plural referents unless the context clearly dictates otherwise. Thus, for example, reference to a luminescent material can include multiple luminescent materials unless the context clearly dictates otherwise.

As used herein, the term "set" refers to a collection of one or more elements. Thus, for example, a set of particles can include a single particle or multiple particles. Elements of a set can also be referred to as members of the set. Elements of a set can be the same or different. In some instances, elements of a set can share one or more common characteristics.

As used herein, the terms "optional" and "optionally" mean that the subsequently described event or circumstance may or may not occur and that the description includes instances where the event or circumstance occurs and instances in which it does not.

As used herein, the term "ultraviolet range" refers to a range of wavelengths from about 5 nanometer ("n") to about 400 nm.

As used herein, the term "visible range" refers to a range of wavelengths from about 400 nm to about 700 nm.

As used herein, the term "infrared range" refers to a range of wavelengths from about 700 nm to about 2 millimeter ("mm"). The infrared range includes the "near infrared range," which refers to a range of wavelengths from about 700 nm to about 5 micrometer ("μm"), the "middle infrared range," which refers to a range of wavelengths from about 5 μm to about 30 μm, and the "far infrared range," which refers to a range of wavelengths from about 30 μm to about 2 mm.

As used herein, the terms "reflection," "reflect," and "reflective" refer to a bending or a deflection of light. A bending or a deflection of light can be substantially in a single direction, such as in the case of specular reflection, or can be in multiple directions, such as in the case of diffuse reflection or scattering. In general, light incident upon a material and light reflected from the material can have wavelengths that are the same or different.

As used herein, the terms "luminescence," "luminesce," and "luminescent" refer to an emission of light in response to an energy excitation. Luminescence can occur based on relaxation from excited electronic states of atoms or molecules and can include, for example, chemiluminescence, electroluminescence, photoluminescence, thermoluminescence, triboluminescence, and combinations thereof. For example, in the case of electroluminescence, an excited electronic state can be produced based on an electrical excitation. In the case of photoluminescence, which can include fluorescence and phosphorescence, an excited electronic state can be produced based on a light excitation, such as absorption of light. In general, light incident upon a material and light emitted by the material can have wavelengths that are the same or different.

As used herein with respect to photoluminescence, the term "quantum efficiency" refers to a ratio of the number of photons emitted by a material to the number of photons absorbed by the material.

As used herein, the term "absorption spectrum" refers to a representation of absorption of light over a range of wavelengths. In some instances, an absorption spectrum can refer to a plot of absorbance (or transmittance) of a material as a function of wavelength of light incident upon the material.

As used herein, the term "emission spectrum" refers to a representation of emission of light over a range of wavelengths. In some instances, an emission spectrum can refer to a plot of intensity of light emitted by a material as a function of wavelength of the emitted light.

As used herein, the term "excitation spectrum" refers to another representation of emission of light over a range of wavelengths. In some instances, an excitation spectrum can refer to a plot of intensity of light emitted by a material as a function of wavelength of light incident upon the material.

As used herein, the term "Full Width at Half Maximum" or "FWHM" refers to a measure of spectral width. In the case of an emission spectrum, a FWHM can refer to a width of the emission spectrum at half of a peak intensity value.

As used herein with respect to an excitation spectrum, the term "substantially flat" refers to being substantially invariant with respect to a change in wavelength. In some instances, an excitation spectrum can be referred to as being substantially flat over a range of wavelengths if intensity values within that range of wavelengths exhibit a standard deviation of less than 20 percent with respect to an average intensity value, such as less than 10 percent or less than 5 percent.

As used herein, the term "sub-nanometer range" or "sub-nm range" refers to a range of dimensions less than about 1 nm, such as from about 0.1 nm to slightly less than about 1 nm.

As used herein, the term "nanometer range" or "nm range" refers to a range of dimensions from about 1 nm to about 1 μm. The nm range includes the "lower nm range," which refers to a range of dimensions from about 1 nm to about 10 nm, the "middle nm range," which refers to a range of dimensions from about 10 nm to about 100 nm, and the "upper nm range," which refers to a range of dimensions from about 100 nm to about 1 μm.

As used herein, the term "micrometer range" or "μm range" refers to a range of dimensions from about 1 μm to about 1 mm. The μm range includes the "lower μm range," which refers to a range of dimensions from about 1 μm to about 10 μm, the "middle μm range," which refers to a range of dimensions from about 10 μm to about 100 μm, and the "upper μm range," which refers to a range of dimensions from about 100 μm to about 1 mm.

As used herein, the term "size" refers to a characteristic dimension of an object. In the case of a particle that is spherical, a size of the particle can refer to a diameter of the particle. In the case of a particle that is non-spherical, a size of the particle can refer to an average of various orthogonal dimensions of the particle. Thus, for example, a size of a particle that is a spheroidal can refer to an average of a major axis and a minor axis of the particle. When referring to a set of particles as having a particular size, it is contemplated that the particles can have a distribution of sizes around that size. Thus, as used herein, a size of a set of particles can refer to a typical size of a distribution of sizes, such as an average size, a median size, or a peak size.

As used herein, the term "monodisperse" refers to being substantially uniform with respect to a set of characteristics. Thus, for example, a set of particles that are monodisperse can refer to such particles that have a narrow distribution of sizes around a typical size of the distribution of sizes. In some instances, a set of particles that are monodisperse can have sizes exhibiting a standard deviation of less than 20 percent with respect to an average size, such as less than 10 percent or less than 5 percent.

As used herein, the term "monolayer" refers to a single complete coating of a material with no additional material added beyond the complete coating.

As used herein, the term "dopant" refers to a chemical entity that is present in a material as an additive or an impurity. In some instances, the presence of a dopant in a material can alter a set of characteristics of the material, such as its chemical, magnetic, electronic, or optical characteristics.

As used herein, the term "electron acceptor" refers to a chemical entity that has a tendency to attract an electron from another chemical entity, while the term "electron donor" refers to a chemical entity that has a tendency to provide an electron to another chemical entity. In some instances, an electron acceptor can have a tendency to attract an electron from an electron donor. It should be recognized that electron attracting and electron providing characteristics of a chemical entity are relative. In particular, a chemical entity that serves as an electron acceptor in one instance can serve as an electron donor in another instance. Examples of electron acceptors include positively charged chemical entities and chemical entities including atoms with relatively high electronegativities. Examples of electron donors include negatively charged chemical entities and chemical entities including atoms with relatively low electronegativities.

As used herein, the term "nanoparticle" refers to a particle that has a size in the nm range. A nanoparticle can have any of a variety of shapes, such as box-shaped, cube-shaped, cylindrical, disk-shaped, spherical, spheroidal, tetrahedral, tripodal, tube-shaped, pyramid-shaped, or any other regular or irregular shape, and can be formed of any of a variety of materials. In some instances, a nanoparticle can include a core formed of a first material, which core can be optionally surrounded by an outer layer formed of a second material. The first material and the second material can be the same or different. Depending on the configuration of a nanoparticle, the nanoparticle can exhibit size dependent characteristics associated with quantum confinement. However, it is also contemplated that a nanoparticle can substantially lack size dependent characteristics associated with quantum confinement or can exhibit such size dependent characteristics to a low degree.

As used herein, the term "surface ligand" refers to a chemical entity that can be used to form an outer layer of a particle, such as a nanoparticle. A surface ligand can have an affinity for or can be chemically bonded, either covalently or non-covalently, to a core of a nanoparticle. In some instances, a surface ligand can be chemically bonded to a core at multiple portions along the surface ligand. A surface ligand can optionally include a set of active portions that do not interact specifically with a core. A surface ligand can be substantially hydrophilic, substantially hydrophobic, or substantially amphiphilic. Examples of surface ligands include organic molecules, such as hydroquinone, ascorbic acid, silanes, and siloxanes; polymers (or monomers for a polymerization reaction), such as polyvinylphenol; and inorganic complexes. Additional examples of surface ligands include chemical groups, such alkyl groups, alkenyl groups, alkynyl groups, aryl groups, iminyl groups, hydride groups, halo groups, hydroxy groups, alkoxy groups, alkenoxy groups, alkynoxy groups, aryloxy groups, carboxy groups, alkylcarbonyloxy groups, alkenylcarbonyloxy groups, alkynylcarbonyloxy groups, arylcarbonyloxy groups, thio groups, alkylthio groups, alkenylthio groups, alkynylthio groups, arylthio groups, cyano groups, nitro groups, amino groups, N-substituted amino groups, alkylcarbonylamino groups, N-substituted alkylcarbonylamino groups, alkenylcarbonylamino groups, N-substituted alkenylcarbonylamino groups, alkynylcarbonylamino groups, N-substituted alkynylcarbonyl amino groups, aryl carbonylamino groups, N-substituted arylcarbonyl amino groups, silyl groups, and siloxy groups.

Luminescent Materials

Embodiments of the invention relate to luminescent materials having a number of desirable characteristics. In particular, luminescent materials according to some embodiments of the invention can exhibit photoluminescence with a high quantum efficiency, with a narrow spectral width, and with a peak emission wavelength located within a desirable range of wavelengths. Also, these photoluminescent characteristics can be relatively insensitive over a wide range of excitation wavelengths. Without being bound by a particular theory, these unusual and desirable characteristics can derive at least partly from a particular microstructure of the luminescent materials and the presence of dopants within that microstructure. Advantageously, the luminescent materials can be readily processed to form a variety of products, which, in turn, can be used in anti-counterfeiting, inventory, and other applications.

In particular, luminescent materials according to some embodiments of the invention can exhibit photoluminescence with a high quantum efficiency, thereby facilitating detection or imaging of the luminescent materials upon irradiation. In some instances, the quantum efficiency can be greater than about 6 percent, such as at least about 10 percent, at least about 20 percent, at least about 30 percent, at least about 40 percent, or at least about 50 percent, and can be up to about 90 percent or more. However, it is also contemplated that the quantum efficiency can be less than about 6 percent, such as less than about 1 percent. As can be appreciated, a high quantum efficiency can translate into a higher relative intensity for emitted light and an improved signal-to-noise ratio with respect to incident light or other background noise.

Also, the luminescent materials can exhibit photoluminescence with a narrow spectral width, thereby further facilitating detection or imaging of the luminescent materials upon irradiation. In some instances, the spectral width can be no greater than about 120 nm at FWHM, such as no greater than about 100 nm or no greater than about 80 nm at FWHM. Thus, for example, the spectral width can be in the range of about 20 nm to about 120 nm at FWHM, such as from about 50 nm to about 120 nm, from about 50 nm to about 100 nm, or from about 50 nm to about 80 nm at FWHM. As can be appreciated, a narrow spectral width can translate into an improved resolution for emitted light with respect to incident light or other background noise.

In addition, the luminescent materials can exhibit photoluminescence with a peak emission wavelength located within a desirable range of wavelengths, such as the visible range or the infrared range. In some instances, the peak emission wavelength can be located in the near infrared range, such as from about 900 nm to about 1 µm, from about 910 nm to about 1 µm, from about 910 nm to about 980 nm, or from about 930 nm to about 980 nm. In other instances, the peak emission wavelength can be located in the range of about 700 nm to about 800 nm, such as from about 700 nm to about 750 nm or from about 700 nm to about 715 nm. However, it is also contemplated that the peak emission wavelength can be located in the middle infrared range, the far infrared range, the ultraviolet range, or the visible range. As can be appreciated, emission of light at relatively long wavelengths can be particularly useful for applications in which it is desirable to distinguish photoluminescent and scattering characteristics upon irradiation. Thus, for example, it can be desirable to obtain a photoluminescence image while substantially reducing, removing, or filtering out contributions from scattered light. Since scattering of light is reduced for longer wavelengths, photoluminescence in the visible range or the infrared range can translate into a higher relative intensity for emitted light and an improved signal-to-noise ratio with respect to scattered light or other background noise. Also, since emitted light in the infrared range is not visible, the luminescent materials can be advantageously used to form covert markings for anti-counterfeiting applications.

Furthermore, the photoluminescent characteristics described above can be relatively insensitive over a wide range of excitation wavelengths. Indeed, this unusual characteristic can be appreciated with reference to excitation spectra of the luminescent materials, which excitation spectra can be substantially flat over a range of excitation wavelengths encompassing portions of the ultraviolet range, the visible range, and the infrared range. In some instances, the excitation spectra can be substantially flat over a range of excitation wavelengths from about 200 nm to about 1 µm, such as from about 200 nm to about 980 nm or from about 200 nm to about 950 nm. However, it is also contemplated that the excitation spectra can include a set of bands within that range of excitation wavelengths. As can be appreciated, insensitivity to a range of excitation wavelengths can allow enhanced flexibility in the selection of light sources for irradiating the luminescent materials. In turn, this enhanced flexibility can allow the use of light sources that are inexpensive and widely available. Alternatively, or in conjunction, this enhanced flexibility can allow the use of light sources that emit light within a desirable range of wavelengths, such as the visible range or the infrared range. Since scattering of light is reduced for longer wavelengths, the use of light sources that emit light in the visible range or the infrared range can be particular useful for applications in which it is desirable to distinguish photoluminescent and scattering characteristics upon irradiation.

According to some embodiments of the invention, one method to form a luminescent material involves a conversion of a set of ingredients into the luminescent material at high yields and at moderate temperatures and pressures. The method can be represented with reference to the formula:

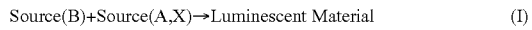

Source(B)+Source(A,X)→Luminescent Material    (I)

In formula (I), source(B) serves as a source of B, and, in some instances, source(B) can also serve as a source of dopants. B can be selected from elements having suitable oxidation states, such that their ground electronic states include filled s orbitals and can be represented as $(ns)^2$. Examples of B include elements of Group 5, such as vanadium (e.g., as V(III) or $V^{+3}$); elements of Group 11, such as copper (e.g., as Cu(I) or $Cu^{+1}$), silver (e.g., as Ag(I) or $Ag^{+1}$), and gold (e.g., as Au(I) or $Au^{+1}$); elements of Group 12, such as zinc (e.g., as Zn(II) or $Zn^{+2}$), cadmium (e.g., as Cd(II) or $Cd^{+2}$), and mercury (e.g., as Hg(II) or $Hg^{+2}$); elements of Group 13, such as gallium (e.g., as Ga(I) or $Ga^{+1}$), indium (e.g., as In(I) or $In^{+1}$), and thallium (e.g., as Tl(I) or $Tl^{+1}$); elements of Group 14, such as germanium (e.g., as Ge(II) or $Ge^{+2}$ or as Ge(IV) or $Ge^{+4}$), tin (e.g., as Sn(II) or $Sn^{+2}$ or as Sn(IV) or $Sn^{+4}$), and lead (e.g., as Pb(II) or $Pb^{+2}$ or as Pb(IV) or $Pb^{+4}$); and elements of Group 15, such as bismuth (e.g., as Bi(III) or $Bi^{+3}$).

In the case that B is tin, for example, source(B) can include one or more types of tin-containing compounds selected from tin(II) compounds of the form BY, $BY_2$, $B_3Y_2$, and $B_2Y$ and tin (IV) compounds of the form $BY_4$, where Y can be selected from elements of Group 16, such as oxygen (e.g., as $O^{-2}$); elements of Group 17, such as fluorine (e.g., as $F^{-1}$), chlorine (e.g., as $Cl^{-1}$), bromine (e.g., as $Br^{-1}$), and iodine (e.g., as $I^{-1}$); and poly-elemental chemical entities, such as nitrate (i.e., $NO_3^{-1}$), thiocyanate (i.e., $SCN^{-1}$), hypochlorite (i.e., $OCl^{-1}$), sulfate (i.e., $SO_4^{-2}$), orthophosphate (i.e., $PO_4^{-2}$), metaphosphate (i.e., $PO_3^{-1}$), oxalate (i.e., $C_2O_4^{-2}$), methanesulfonate (i.e., $CH_3SO_3^{-1}$), trifluoromethanesulfonate (i.e., $CF_3SO_3^{-1}$), and pyrophosphate (i.e., $P_2O_7^{-4}$). Examples of tin(II) compounds include tin(II) fluoride (i.e., $SnF_2$), tin(II) chloride (i.e., $SnCl_2$), tin(II) chloride dihydrate (i.e., $SnCl_2.2H_2O$), tin(II) bromide (i.e., $SnBr_2$), tin(II) iodide (i.e., $SnI_2$), tin(II) oxide (i.e., SnO), tin(II) sulfate (i.e., $SnSO_4$), tin(II) orthophosphate (i.e., $Sn_3(PO_4)_2$), tin(II) metaphosphate (i.e., $Sn(PO_3)_2$), tin(II) oxalate (i.e., $Sn(C_2O_4)$), tin(II) methanesulfonate (i.e., $Sn(CH_3SO_3)_2$), tin(II) pyrophosphate (i.e., $Sn_2P_2O_7$), and tin(II) trifluoromethanesulfonate (i.e., $Sn(CF_3SO_3)_2$). Examples of tin (IV) compounds include tin (IV) chloride (i.e., $SnCl_4$) and tin(IV) chloride pentahydrate (i.e., $SnCl_4.5H_2O$).

In formula (I), source(A, X) serves as a source of A and X, and, in some instances, source(A, X) can also serve as a source of dopants. A is a metal that can be selected from elements of Group 1, such as sodium (e.g., as Na(I) or $Na^{1+}$), potassium (e.g., as K(I) or $K^{1+}$), rubidium (e.g., as Rb(I) or $Rb^{1+}$), and cesium (e.g., as Cs(I) or $Cs^{1+}$), while X can be selected from elements of Group 17, such as fluorine (e.g., as $F^{-1}$), chlorine (e.g., as $Cl^{-1}$), bromine (e.g., as $Br^{-1}$), and iodine (e.g., as $I^{-1}$). Examples of source(A, X) include alkali halides of the form AX. In the case that A is cesium, for example, source(A, X) can include one or more types of cesium(I) halides, such as cesium(I) fluoride (i.e., CsF), cesium(I) chloride (i.e., CsCl), cesium(I) bromide (i.e., CsBr), and cesium(I) iodide (i.e., CsI). It is contemplated that different types of source(A, X) can be used (e.g., as source(A, X), source(A, X'), and source(A, X") with X, X', and X" independently selected from elements of Group 17) to form a resulting luminescent material having mixed halides.

The method represented by formula (I) can be performed by mixing source(B) and source(A, X) in a dry form, in solution, or in accordance with any other suitable mixing technique. For example, source(B) and source(A, X) can be provided in a powdered form, and can be mixed using a mortar and a pestle. As another example, source(B) and source(A, X) can be dispersed in a reaction medium to form a reaction mixture. The reaction medium can include a solvent or a mixture of solvents, which can be selected from a variety of standard solvents, such as alcohols (e.g., methanol, ethanol, isopropyl alcohol, butanol, and ethylene glycol), alkanes (e.g., hexane, heptane, decane, docosane, and octadecane), arenes (e.g., benzene, chlorobenzene, dichlorobenzene, naphthalene, tetralin, toluene, xylene, and mesitylene), amines (e.g., triethylamine), ethers (e.g., glyme, diglyme, triglyme, and tetrahydrofuran), amides (e.g., dimethylformamide), ketones (e.g., acetone and N-methyl pyrrolidone), sulfoxides (e.g., dimethylsulfoxide), and water. The reaction medium can also include one or more of the following ingredients: a dispersant (e.g., a coupling agent), a wetting agent (e.g., a surfactant, such as sodium dodecyl sulfate, a polymeric surfactant, or any other suitable ionic or non-ionic surfactant), a polymer binder (or other vehicle), an anti-foaming agent, a preservative, a stabilizer, and a pH adjusting agent. It is also contemplated that a suitable deposition technique can be used in place of, or in conjunction with, a mixing technique. For example, source(B) and source(A, X) can be subjected to electron-beam deposition, sputter deposition, pulsed laser deposition, vacuum deposition, or vapor deposition to form a film, which can be annealed to form the luminescent material. In particular, source(B) and source(A, X) can be co-evaporated (e.g., co-vaporized) and co-deposited on a substrate to form a film, or can be sequentially evaporated (e.g., vaporized) and deposited to form adjacent films.

In some instances, the conversion of source(B) and source (A, X) into the luminescent material can be facilitated by applying a form of energy, such as acoustic or vibrational energy, electrical energy, magnetic energy, mechanical energy, optical energy, or thermal energy. It is also contemplated that multiple forms of energy can be applied simultaneously or sequentially. For example, source(B) and source (A, X) can be mixed in a dry form, and the resulting mixture can be pressed to a pressure in the range of about $1 \times 10^5$ Pascal to about $7 \times 10^8$ Pascal, such as using a standard pellet press or a standard steel die, to form the luminescent material in a pellet form. As another example, source(B) and source(A, X) can be mixed in a dry form, and the resulting mixture can be heated to a temperature in the range of about 50° C. to about 650° C., such as from about 80° C. to about 350° C. or from about 80° C. to about 300° C., to form the luminescent material. If desired, heating can be performed in an inert atmosphere (e.g., a nitrogen atmosphere) or a reducing atmosphere for a time period in the range of about 0.5 hour to about 9 hours.

The resulting luminescent material can include A, B, and X as major elemental components as well as elemental components derived from or corresponding to Y. In particular, B can be present in an amount that is greater than a typical doping level, such as at least about 1 percent or at least about 5 percent in terms of elemental composition. Also, the luminescent material can include additional elemental components, such as carbon, chlorine, hydrogen, and oxygen, that can be present in amounts that are less than about 5 percent in terms of elemental composition, and further elemental components, such as sodium, sulfur, phosphorus, and potassium, that can be present in trace amounts that are less than about 0.1 percent in terms of elemental composition.

Without being bound by a particular theory, the resulting luminescent material can be represented with reference to the formula:

  (II)

In formula (II), a is an integer that can be in the range of 1 to 9, such as 1 to 5; b is an integer that can be in the range of 1 to 5, such as from 1 to 3; and x is an integer that can be in the range of 1 to 9, such as from 1 to 5. In some instances, a can be equal to 1, and x can be equal to 1+2b. It is also contemplated that one or more of a, b, and x can have fractional values within their respective ranges. It is further contemplated that $X_x$ in formula (II) can be more generally represented as $X_x X'_{x'} X''_{x''}$, where X, X', and X" can be independently selected from elements of Group 17, and the sum of x, x', and x" can be in the range of 1 to 9, such as from 1 to 5. With reference to the generalized version of formula (II), a can be equal to 1, and the sum of x, x', and x" can be equal to 1+2b. Again, without being bound by a particular theory, the luminescent material can be a semiconductor having a resistivity and a band gap energy that can be tuned to desirable levels by adjusting ingredients and processing conditions that are used. For example, the band gap energy can correlate with A, with the order of increasing band gap energy corresponding to, for example, cesium, rubidium, potassium, and sodium. As another example, the band gap energy can correlate with X, with the order of increasing band gap energy corresponding to, for example, iodine, bromine, chlorine, and fluorine. This order of increasing band gap energy can translate into an order of decreasing peak emission wavelength.

Thus, for example, the luminescent material including iodine can sometimes exhibit a peak emission wavelength in the range of about 900 nm to about 1 μm, while the luminescent material including bromine or chlorine can sometimes exhibit a peak emission wavelength in the range of about 700 nm to about 800 nm.

In the case that A is cesium, B is tin, and X is iodine, for example, the luminescent material can sometimes be represented with reference to one of the formulas:

  (III)

  (IV)

  (V)

In the case of formula III, for example, the resulting luminescent material can have a perovskite-based microstructure that is layered with relatively strong chemical bonding along a particular layer but relatively weak chemical bonding between different layers. This perovskite-based microstructure can undergo transitions between a variety of phases that have different colors. The luminescent material of formula III can be a semiconductor having a resistivity and a band gap energy that can be tuned to desirable levels by adjusting ingredients and processing conditions that are used. For example, the resistivity can be varied by a factor of 100 or more with respect to a typical value of about 100 μΩ.cm. Similarly, the band gap energy can be varied from about 1.2 eV to about 2.3 eV, and can correlate with a color of the luminescent material, with the order of increasing band gap energy corresponding to, for example, black, orange, and yellow.

In the case that A is cesium, B is indium, and X is iodine, for example, the luminescent material can sometimes be represented with reference to the formula:

  (VI)

In the case that A is cesium, B is germanium, and X is iodine, for example, the luminescent material can sometimes be represented with reference to the formula:

  (VII)

In the case that A is rubidium, B is tin, and X is iodine, for example, the luminescent material can sometimes be represented with reference to the formula:

  (VIII)

In the case that A is potassium, B is tin, and X is iodine, for example, the luminescent material can sometimes be represented with reference to the formula:

  (IX)

In the case that A is cesium, B is indium, and X is bromine, for example, the luminescent material can sometimes be represented with reference to the formula:

  (X)

In the case that A is cesium, B is tin, and X is bromine, for example, the luminescent material can sometimes be represented with reference to the formula:

  (XI)

In the case that A is cesium, B is tin, X is chlorine, and X' is iodine, for example, the luminescent material can sometimes be represented with reference to one of the formulas:

  (XII)

  (XIII)

In the case that A is cesium, B is tin, X is bromine, and X' is iodine, for example, the luminescent material can sometimes be represented with reference to the formula:

[CsSnBr$_2$I][dopants]     (XIV)

The dopants included in the luminescent material can be present in amounts that are less than about 5 percent, such as less than about 1 percent, in terms of elemental composition, and can derive from source(A) or other ingredients that are used to form the luminescent material. In the case that A is cesium, B is tin, and X is iodine, for example, the dopants can include cations derived from or corresponding to tin (e.g., Sn(IV) or Sn$^{+4}$ cations derived from oxidation of tin) and anions derived from or corresponding to Y (e.g., as F$^{-1}$, Cl$^{-1}$, Br$^{-1}$, I$^{-1}$, or CH$_3$SO$_3$$^{-1}$ anions). The cations and anions can form electron acceptor/electron donor pairs that are dispersed within a microstructure of the luminescent material. Again, without being bound by a particular theory, photoluminescent characteristics of the luminescent material can derive at least partly from the presence of these electron acceptor/electron donor pairs within that microstructure.

Nanoparticles Formed of Luminescent Materials

Luminescent materials according to some embodiments of the invention can be readily processed to form a variety of products, which, in turn, can be used in anti-counterfeiting, inventory, and other applications. For example, the luminescent materials can be readily processed to form particles having a range of sizes, such as in the sub-nm range, the nm range, or the μm range. Methods for forming the particles include ball milling, jar milling, ultrasonic treatment, or any other suitable grinding or powdering technique. As further described below, the particles can each include an outer layer, which can be formed using any suitable coating or encapsulation technique. The resulting particles can be monodisperse or polydisperse with respect to their shapes and sizes.

For certain anti-counterfeiting and inventory applications, luminescent materials can be processed to form particles having sizes in the nm range, such as the lower nm range, the middle nm range, or the upper nm range. The resulting nanoparticles can be monodisperse with respect to either of, or both, their shapes and sizes. Such characteristics of the nanoparticles are desirable so as to facilitate incorporation of the nanoparticles in an ink composition, which, in turn, can be used to form markings for objects. In particular, such characteristics can allow adequate dispersion of the nanoparticles within the composition, and can allow the composition to be readily applied using a standard coating or printing technique. In addition, the presence of the nanoparticles in the resulting markings can be relatively unnoticeable, such that the markings can serve as covert markings for anti-counterfeiting applications.

In some instances, a nanoparticle can include a core formed of a luminescent material, such as one that exhibits photoluminescence in the near infrared range, and the core can be optionally surrounded by an outer layer. Depending on the specific application, the core can be formed of a single luminescent material or different luminescent materials. The core can have any of a variety of shapes, such as cylindrical, disk-shaped, spherical, spheroidal, or any other regular or irregular shape, and can have a range of sizes, such as in the lower nm range or the middle nm range.

The outer layer can provide environmental protection and isolation for the core, thereby providing improved stability to the core and retaining desirable photoluminescent characteristics for a prolonged period of time. The outer layer can also provide chemical compatibility with a solvent or a polymer binder when forming an ink composition, thereby improving dispersion of the nanoparticle in the resulting composition. The outer layer can be formed of any of a variety of inorganic and organic materials, such as intrinsic semiconductors, intrinsic insulators, oxides (e.g., silicon oxide, aluminum oxide, titanium oxide, and zirconium oxide), metals, metal alloys, and surface ligands. Thus, for example, the outer layer can be formed as an oxide shell that surrounds the core. As another example, the outer layer can be formed as a ligand layer that surrounds the core. Depending on the specific application, the outer layer can be formed of a single material or different materials.

In some instances, the outer layer can be "complete," such that the outer layer completely covers a surface of the core to cover all surface atoms of the core. Alternatively, the outer layer can be "incomplete," such that the outer layer partially covers the surface of the core to partially cover the surface atoms of the core. The outer layer can have a range of thicknesses, such as in the sub-nm range, the lower nm range, or the middle nm range. The thickness of the outer layer can also be expressed in terms of a number of monolayers of a material forming the outer layer. Thus, for example, the thickness of the outer layer can be in the range of about 0 to about 20 monolayers, such as from about 1 to about 10 monolayers. A non-integer number of monolayers can correspond to a case in which the outer layer includes incomplete monolayers. Incomplete monolayers can be homogeneous or inhomogeneous, and can form islands or clumps on the surface of the core. Depending on the specific application, the outer layer can include multiple sub-layers that are formed of the same material or different materials in an onion-like configuration.

Markings for Anti-counterfeiting and Inventory Applications

Certain embodiments of the invention relate to the use of luminescent materials for anti-counterfeiting and inventory applications. In particular, nanoparticles formed of the luminescent materials can be used to form markings for objects. The markings can serve as security markings that are difficult to reproduce and, thus, can be advantageously used in anti-counterfeiting applications. For example, the markings can be used to verify whether objects bearing those markings are authentic or original. Alternatively, or in conjunction, the markings can serve as identification markings and, thus, can be advantageously used in inventory applications. For example, the markings can be used to track identities or locations of objects bearing those markings as part of inventory control.

For some embodiments of the invention, a marking can include multiple elements, including: (1) a spatial pattern; and (2) an array of nanoparticles to encode a set of signatures based on photoluminescence or other optical or non-optical characteristics of the nanoparticles. For example, an ink composition can be formed so as to include nanoparticles dispersed therein, and the ink composition can be printed on an object of interest to form a marking thereon. The marking can be formed in a spatial pattern, such as a bar code. While the spatial pattern may be reproduced, the random positions of the nanoparticles within the marking can be difficult or virtually impossible to reproduce. FIG. 1 illustrates three different images 100, 102, and 104 that can be obtained by irradiating three different random arrays of nanoparticles formed in accordance with an embodiment of the invention. As illustrated in FIG. 1, the random positions of nanoparticles within each array can provide a photoluminescence pattern that is substantially unique.

As part of a registration process, a reference image of a marking can be obtained by irradiating the marking, and the reference image can be stored for later comparison. For authentication purposes, an authentication image of the marking can be obtained, and the authentication image can be compared with the reference image. If there is a sufficient match between the images, an object bearing the marking can be deemed to be authentic or original. Advantageously, a spatial pattern included in the marking can be used to derive an index with respect to which the reference image is stored, and this index can be used to select or target the reference image for subsequent image comparison. In such manner, this index allows rapid matching of images while avoiding the need for a time-consuming search through multiple reference images.

Figure 2:
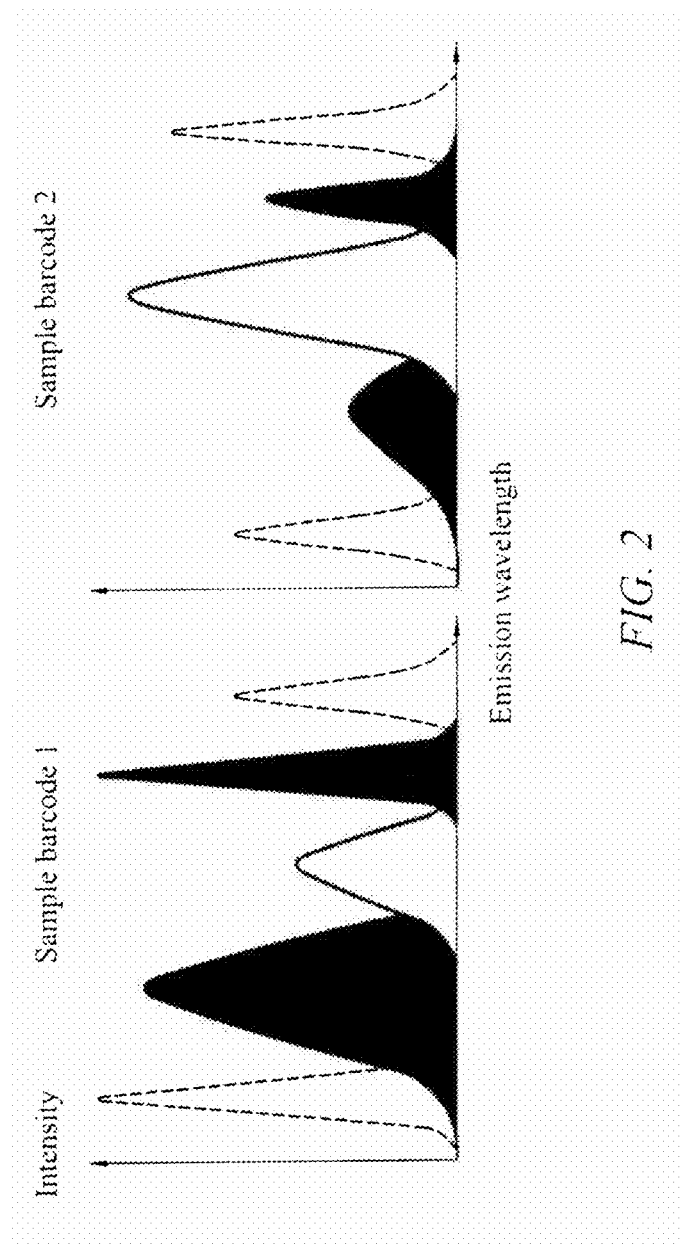
FIG. 2 illustrates spectral encoding that can be obtained by adjusting relative proportions of nanoparticles having different emission spectra, according to an embodiment of the invention.

In some instances, a marking can be formed so as to include a mixture of nanoparticles that differ in their photoluminescence or other optical or non-optical characteristics. In particular, the nanoparticles can be formed of luminescent materials that differ in some fashion, such as by having different elemental compositions or by having different concentrations or types of dopants. FIG. 2 illustrates spectral encoding that can be obtained by adjusting relative proportions of nanoparticles having different emission spectra. As illustrated in FIG. 2, the different emission spectra can provide multiple colors with respective intensities that can be tuned to desired levels.

Formation of Markings

A variety of methods can be used to form the markings described herein. In some instances, a coating, ink, or varnish composition can be formed so as to include a set of nanoparticles dispersed therein. The composition can include the nanoparticles as a pigment along with one or more of the following ingredients: a solvent, a dispersant (e.g., a coupling agent), a wetting agent (e.g., a surfactant, such as sodium dodecyl sulfate, a polymeric surfactant, or any other suitable ionic or non-ionic surfactant), a polymer binder (or other vehicle), an anti-foaming agent, a preservative, a stabilizer, and a pH adjusting agent. Next, a coating or printing technique can be used to apply the composition on an object of interest (or another object that is coupled to or encloses the object of interest), which serves as a substrate. Thus, for example, a marking can be formed using a standard coating technique, such as roller coating or spray coating, or using a standard printing technique, such as ink jet printing, offset printing, gravure printing, flexography printing, intaglio printing, or screen printing. Using a standard coating or printing technique, the nanoparticles can be deposited as a random array within a spatial pattern, which allows rapid matching of images.

To achieve higher levels of security, an ink composition can include a set of inert masking agents that provide a mixed compositional signature when using chemical analytical techniques. Also, the composition can include a relatively low concentration of nanoparticles (e.g., a few micrograms per marking), thus rendering chemical analysis difficult.

It is also contemplated that a marking can be formed by incorporating nanoparticles within an object of interest (or another object that is coupled to or encloses the object of interest). Thus, for example, the nanoparticles can be incorporated during formation of the object of interest, rather than deposited afterwards. In particular, a matrix material including the nanoparticles can be cast into a film, a slab, or any other shape. The matrix material is desirably substantially transparent so that emitted light produced by the nanoparticles can be distinguished in a resulting image. For example, the matrix material can include a polymer, such as polycarbonate, polystyrene, or polyvinyl chloride, or an inorganic glass, such as a silicate, a borosilicate, or a phosphate glass. It is contemplated that the matrix material need not be substantially transparent and can include, for example, paper. In the case of a thin film, such as one that is about 10 µm or less in thickness, the nanoparticles can be effectively viewed as a two-dimensional array in a single optical plane. In the case of a thicker film or a self-supporting slab, the nanoparticles can be viewed as a three-dimensional array. In this case, a resulting image of the nanoparticles can depend on a viewing angle. If desired, the nanoparticles can be viewed from multiple directions and angles, resulting in different images.

Security System

Figure 3:
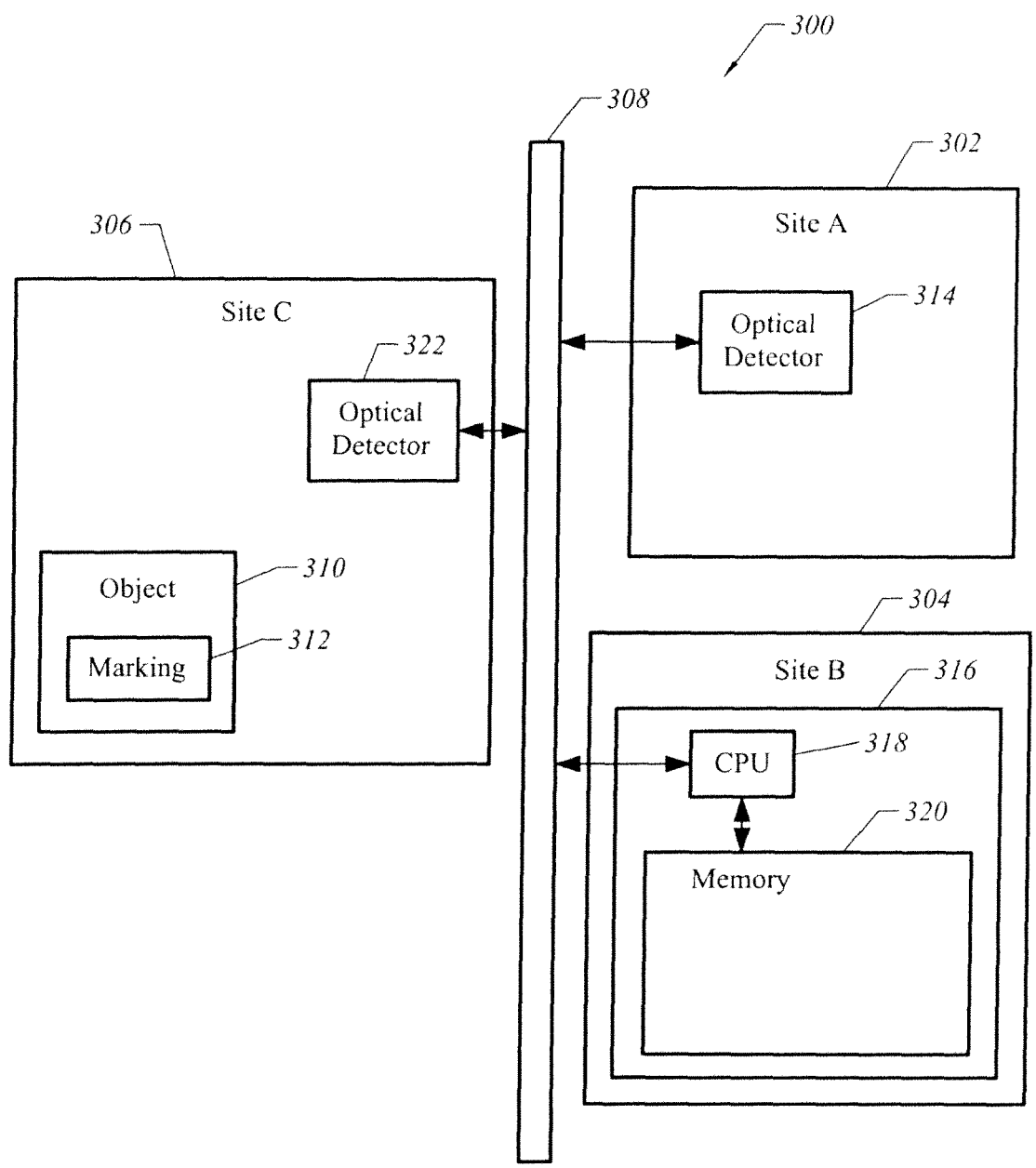
FIG. 3 illustrates a security system that can be implemented in accordance with an embodiment of the invention.

FIG. 3 illustrates a system 300 that can be implemented in accordance with an embodiment of the invention. As further described below, the system 300 can be operated as a security system to prevent or reduce counterfeiting of objects, such as consumer products, credit cards, identification cards, passports, currency, and so forth.

As illustrated in FIG. 3, the system 300 includes a number of sites, including site A 302, site B 304, and site C 306. Site A 302, site B 304, and site C 306 are connected to a computer network 308 via any wired or wireless communication channel. In the illustrated embodiment, site A 302 is a manufacturing site, a distribution site, or a retail site for an object 310, site B 304 is an authentication and registration site for the object 310, and site C 306 is a site at which a customer is located. While FIG. 3 illustrates the object 310 as being located at site C 306, it is contemplated that the object 310 can be initially located at site A 302 before being conveyed to site C 306.

The illustrated embodiment can be further understood with reference to a sequence of operations that can be performed using the system 300. First, at site A 302, a marking 312 is applied to the object 310 (or another object that is coupled to or encloses the object 310). The marking 312 is formed in a spatial pattern, such as a bar code, and includes a random array of nanoparticles that exhibit photoluminescence. As part of a registration process, a reference image of the marking 312 is obtained using an optical detector 314, and the reference image is transmitted to site B 304 along with a request for registration. The reference image includes a representation of the spatial pattern as well as a photoluminescence pattern produced by the random array of nanoparticles. In some instances, multiple reference images of the marking 312 can be obtained using various settings for the optical detector 314.

Second, site B 304 receives the reference image and stores the reference image for later comparison. To allow rapid matching of images, the spatial pattern is used to derive an index with respect to which the reference image is stored. As illustrated in FIG. 3, site B 304 includes a computer 316, which can be a server computer such as a Web server. The computer 316 includes standard computer components, including a central processing unit ("CPU") 318 that is connected to a memory 320. The memory 320 can include a database within which the reference image is stored. The memory 320 can also include computer code for performing a variety of image processing operations.

Third, at site C 306, the customer may wish to verify whether the object 310 is authentic or original. As part of an authentication process, an authentication image of the marking 312 is obtained using an optical detector 322, and the authentication image is transmitted to site B 304 along with a request for authentication. Similar to the reference image, the authentication image includes a representation of the spatial pattern as well as a photoluminescence pattern produced by the random array of nanoparticles. The optical detector 322 can be operated using similar settings used for the optical detector 314 when obtaining the reference image. If desired, the authentication image can be at a lower resolution and a greater compression level than the reference image. In some instances, global positioning coordinates can be included in the request for authentication, such that the location of the customer or the object 310 can be determined.

Next, site B 304 receives the authentication image and again derives the index based on the spatial pattern. The index is used as a look-up into the memory 320 to select the reference image for comparison with the authentication image. In such manner, the index allows rapid matching of images while avoiding the need for a time-consuming search through multiple reference images. If the authentication image sufficiently matches the reference image (e.g., within a specific probability range), site B 304 sends a message to the customer at site C 306 confirming that the object 310 is authentic. In addition to such confirmation, site B 304 can send other information related to the object, such as a manufacturing date, a manufacturing location, an expiration date, and so forth. On the other hand, if the authentication image does not sufficiently match the reference image (or any other reference image), site B 304 sends a message indicating that it is unable to confirm that the object 310 is authentic (or that the object 310 is likely to be a reproduction). Site B 304 can also send authentication information to site A 302, such that the level of counterfeiting can be monitored.

While certain components and operations have been described with reference to specific locations, it is contemplated that these components and operations can be similarly implemented at a variety of other locations. Thus, for example, certain components and operations described with reference to site A 302, site B 304, and site C 306 can be implemented at the same location or at another location that is not illustrated in FIG. 3. Also, while the system 300 has been described with reference to a security system, it is contemplated that the system 300 can also be operated as an inventory system to track identities or locations of a variety of objects as part of inventory control.

EXAMPLES

The following examples describe specific aspects of some embodiments of the invention to illustrate and provide a description for those of ordinary skill in the art. The examples should not be construed as limiting the invention, as the examples merely provide specific methodology useful in understanding and practicing some embodiments of the invention.

Example 1

Formation of Luminescent Material

Anhydrous $SnCl_2$ (or $SnCl_2.H_2O$) was mixed with CsI in a powdered form and then pressed with a standard pellet press (5 cm diameter, 5 mm thickness, 8 tons pressure). The ratio of $SnCl_2$ (or $SnCl_2.H_2O$) to CsI was in the range of 0.1 percent to 99.5 percent by weight. The resulting material (in either a pellet form or a powdered form) was then tested for photoluminescence.

Example 2

Formation of Luminescent Material $SnBr_2$ (or $SnI_2$) was mixed with CsI in a powdered form. The ratio of $SnBr_2$ (or $SnI_2$) to CsI was in the range of 10 percent to 90 percent by weight. The resulting material in a powdered form was then tested for photoluminescence in the near infrared range.

Example 3

Formation of Luminescent Material $Sn_2P_2O_7$ was mixed with CsI in a powdered form and then pressed with a standard pellet press (5 cm diameter, 5 mm thickness, 8 tons pressure). The ratio of $Sn_2P_2O_7$ to CsI was in the range of 0.1 percent to 99.5 percent by weight. The resulting material (in either a pellet form or a powdered form) was then tested for photoluminescence.

Example 4

Formation of Luminescent Material

Anhydrous $SnI_2$ was mixed with CsI in a standard jar mill and then milled for 1 hour to 24 hours. The ratio of $SnI_2$ to CsI was in the range of 1 percent to 99 percent by weight. The resulting material was then tested for photoluminescence in the near infrared range.

Example 5

Formation of Luminescent Material

Anhydrous $SnCl_2$ was mixed with CsI with the ratio of $SnCl_2$ to CsI in the range of 1 percent to 20 percent by weight. The resulting mixture was heated in the absence of oxygen to a temperature in the range of 80° C. to 350° C. for a period of ¼ hour to 3 hours. The resulting material was then tested for photoluminescence in the near infrared range.

Example 6

Formation of Luminescent Material

Anhydrous $SnI_2$ was mixed with CsI in a solid form with the ratio of $SnI_2$ to CsI in the range of 1 percent to 50 percent by weight. The resulting mixture was heated to a temperature in the range 80° C. to 300° C. The resulting material was then tested for photoluminescence in the near infrared range.

Example 7

Formation of Luminescent Material

Anhydrous $SnBr_2$ was mixed with CsI in a solid form with the ratio of $SnBr_2$ to CsI in the range of 1 percent to 50 percent by weight. The resulting mixture was heated to a temperature in the range of 80° C. to 300° C. The resulting material was then tested for photoluminescence in the near infrared range.

Example 8

Formation of Luminescent Material

A variety of tin(II) compounds were mixed with CsI by dry mixing to form colored materials, which were then tested for photoluminescence in the near infrared range. The tin(II) compounds included $SnF_2$, $SnO$, $SnSO_4$, $Sn_3(PO_4)_2$, $Sn(PO_3)_2$, $Sn(C_2O_4)$, $Sn(CF_3SO_3)_2$, and the ratio of each tin(II) compound to CsI was in the range of 1 percent to 99 percent by weight.

Example 9

Formation of Luminescent Material

A mixed solution of $SnCl_4.5H_2O$ and $SnCl_2$ was prepared by dissolving $SnCl_4.5H_2O$ in a solvent (ethanol) with constant stirring and then adding a first aliquot of $SnCl_2$ and a second aliquot of $SnCl_2$ after the first aliquot had dissolved. The amount of $SnCl_4.5H_2O$ was in the range of 0.5 percent to 2.5 percent by weight. The amount of $SnCl_2$ for each of the aliquots was in the range of 0.5 percent to 3.5 percent by weight. After dissolution, the resulting solution was stirred for 1 hour to 1,000 hours. CsI in a solid form was then added to the solution with constant stirring in the ratio to $SnCl_2$ of 0.2 percent to 12 percent by weight. The solvent was evaporated to dryness using a standard vacuum evaporator (Rotovap) operating at 40° C. The resulting material was then tested for photoluminescence in the near infrared range.

Example 10

Formation of Luminescent Material

Anhydrous $SnCl_2$ (or $SnCl_2.H_2O$) in the amount of 1 percent to 5 percent by weight was dissolved in a solvent (isopropanol) with constant stirring. After dissolution, CsI was added with constant stirring in the ratio to $SnCl_2$ (or $SnCl_2.H_2O$) of 1 percent to 10 percent by weight. The resulting solution was stirred for more than 1 hour, and the solvent was evaporated to dryness using a standard vacuum evaporator (Rotovap). The resulting solid was dried in a vacuum or nitrogen-filled oven operating at a temperature in the range of 30° C. to 130° C. The resulting material was then tested for photoluminescence in the near infrared range.

Example 11

Formation of Luminescent Material 10 mL of a 50 percent solution of $Sn(CH_3SO_3)_2$ was added to a flask. 20 ml of $H_2O$ was then added to the flask and swirled to mix. CsI was dissolved in 5 ml of $H_2O$ to saturate and then added rapidly to the flask. A black precipitate was formed. The flask was swirled to mix, and the solution was filtered through a medium fritted funnel for less than 40 seconds. The precipitate was washed 4 times with isopropanol and then washed 4 times with hexane. The washed precipitate was filtered dry for 2 minutes and then dried in a vacuum desiccator for more than 4 hours. The resulting black material was then tested for photoluminescence in the near infrared range.

Example 12

Formation of Luminescent Material

The filtrate of Example 11 was centrifuged to form a yellow precipitate. The yellow precipitate was washed twice with hexane and then dried for 3 hours using a vacuum oven operating at 40° C. The resulting yellow material was then tested for photoluminescence in the near infrared range.

Example 13

Formation of Luminescent Material

A variety of tin(II) compounds were mixed with CsI in solution to form colored materials, which were then tested for photoluminescence in the near infrared range. The tin(II) compounds included $SnF_2$, $SnBr_2$, $SnI_2$, $SnO$, $SnSO_4$, $Sn_3(PO_4)_2$, $Sn(PO_3)_2$, $Sn(C_2O_4)$, $Sn_2P_2O_7$, and $Sn(CF_3SO_3)_2$, and the ratio of each tin(II) compound to CsI was in the range of 1 percent to 99 percent by weight. Solvents that were used included water, isopropyl alcohol, methanol, ethanol, dimethylformamide, n-methyl pyrrolidone, dimethylsulfoxide, and butane. The resulting colored materials were separated by filtration, centrifugation, or evaporation.

Example 14

Formation and Characterization of Luminescent Material

A variety of tin-containing compounds were mixed with CsI either by themselves or along with other ingredients, such as stabilizers, surfactants, or polymer binders. Mixing was performed by either dry mixing or in solution. The resulting materials were then tested for photoluminescent using an excitation wavelength of 532 nm. Table 1 below sets forth ingredients and processing conditions that were used along with photoluminescent characteristics of the resulting materials. Referring to Table 1, an amount of a tin-containing compound is represented as a weight fraction with respect to a total weight of the tin-containing compound and CsI that were used. As can be appreciated with reference to Table 1, photoluminescent characteristics were observed to vary as a result of using different ingredients and processing conditions. For example, a peak emission wavelength was observed to vary in the range of about 910 nm to about 980 nm as a result of using different tin(II) compounds. In particular, the peak emission wavelength was observed to correlate with a type of anion derived from the tin(II) compounds, with the order of increasing emission wavelength corresponding to $F^{-1}$, $Cl^{-1}$, $Br^{-1}$, $I^{-1}$, and $CH_3SO_3^{-1}$.

TABLE 1

| Peak Emission Wavelength (nm) | Intensity (Log of Counts per Second) | Tin-containing Compound | Amount of Tin-containing Compound | Other Ingredients | Solvent | Processing Condition |
|---|---|---|---|---|---|---|
| 947 | 6.50 | $Sn(CH_3CO)_2$ | 0.1 | none | none | dry |
| 911 | 10.03 | $Sn(BF_4)_2$ | 0.5 | none | $H_2O$ | solution |
| 947 | 9.77 | $Sn(BF_4)_2$ | 0.5 | none | $H_2O$ | solution |

TABLE 1-continued

| Peak Emission Wavelength (nm) | Intensity (Log of Counts per Second) | Tin-containing Compound | Amount of Tin-containing Compound | Other Ingredients | Solvent | Processing Condition |
|---|---|---|---|---|---|---|
| 944 | 6.84 | $Sn(C_7H_{15}CO)_2$ | 0.01 | none | none | dry |
| 945 | 6.89 | $Sn(CH_3CO_2)_2$ | 0.02 | none | $H_2O$/Dimethyl formamide/ Ethanol | solution |
| 942 | 9.06 | $Sn(CH_3SO_3)_2$ | 0.5 | Na tripoly-phosphate | $H_2O$ | solution |
| 938 | 9.11 | $Sn(CH_3SO_3)_2$ | 0.5 | Na poly-phosphate | $H_2O$ | solution |
| 947 | 9.09 | $Sn(CH_3SO_3)_2$ | 0.2 | none | $H_2O$ | solution |
| 958 | 10.49 | $Sn(CH_3SO_3)_2$ | 0.2 | none | $H_2O$ | solution |
| 936 | 8.57 | $Sn(CH_3SO_3)_2$ | 0.5 | Na tartrate | $H_2O$ | solution |
| 930 | 8.36 | $Sn(CH_3SO_3)_2$ | 0.5 | Na tartrate | $H_2O$ | solution |
| 930 | 8.51 | $Sn(CH_3SO_3)_2$ | 0.5 | none | $H_2O$ | solution |
| 960 | 10.47 | $Sn(CH_3SO_3)_2$ | 0.5 | none | $H_2O$ | solution |
| 947 | 9.76 | $Sn(CH_3SO_3)_2$ | 0.5 | none | $H_2O$ | solution |
| 943 | 8.81 | $Sn(CH_3SO_3)_2$ | 0.4 | none | $H_2O$ | solution |
| 943 | 7.41 | $Sn(CH_3SO_3)_2$ | 0.3 | none | $H_2O$ | solution |
| 955 | 8.75 | $Sn(CH_3SO_3)_2$ | 0.2 | none | $H_2O$ | solution |
| 956 | 10.00 | $Sn(CH_3SO_3)_2$ | 0.1 | none | $H_2O$ | solution |
| 937 | 8.74 | $Sn(CH_3SO_3)_2$ | 0.5 | none | $H_2O$ | solution |
| 943 | 6.27 | $Sn(CH_3SO_3)_2$ | 0.5 | Polystyrene | $H_2O$/Tetra-hydrofuran | solution |
| 943 | 7.56 | $Sn(CH_3SO_3)_2$ | 0.01 | $I_2$ | Toluene | solution |
| 930 | 7.16 | $Sn(CH_3SO_3)_2$ | 0.5 | Ascorbic acid | $H_2O$ | solution |
| 943 | 7.78 | $Sn(CH_3SO_3)_2$ | 0.5 | Na Polystyrene sulfonate | $H_2O$ | solution |
| 943 | 8.36 | $Sn(CH_3SO_3)_2$ | 0.5 | Docosane | $H_2O$/Decane | solution |
| 931 | 8.29 | $Sn(CH_3SO_3)_2$ | 0.5 | $CsI_3$ | $H_2O$ | solution |
| 958 | 9.74 | $Sn(CH_3SO_3)_2$ | 0.1 | AIBN | $H_2O$ | solution |
| 942 | 7.58 | $Sn(CH_3SO_3)_2$ | 0.5 | Docosane | $H_2O$ | solution |
| 959 | 9.88 | $Sn(CH_3SO_3)_2$ | 0.2 | none | $H_2O$ | solution |
| 946 | 7.98 | $Sn(CH_3SO_3)_2$ | 0.05 | AIBN | $H_2O$ | solution |
| 946 | 7.98 | $Sn(CH_3SO_3)_2$ | 0.05 | AIBN | $H_2O$ | solution |
| 947 | 6.25 | $Sn(CH_3SO_3)_2$ | 0.5 | $K_2CO_3$ | $CH_3CN$ | solution |
| 958 | 8.16 | $Sn(CH_3SO_3)_2$ | 0.5 | $N(CH_3CH_2)_3$ (pH = 2-3) | $H_2O$/Ethanol | solution |
| 958 | 8.16 | $Sn(CH_3SO_3)_2$ | 0.5 | $N(CH_3CH_2)_3$ (pH = 2-3) | $H_2O$/Ethanol | solution |
| 960 | 10.07 | $Sn(CH_3SO_3)_2$ | 0.5 | Mol. Sieves 4A | $H_2O$ | solution |
| 961 | 9.95 | $Sn(CH_3SO_3)_2$ | 0.5 | $SiO_2$(JV14-223) | $H_2O$ | solution |
| 959 | 7.71 | $Sn(CH_3SO_3)_2$ | 0.5 | $SiO_2$(JV14-223) | $H_2O$ | solution |
| 979 | 10.18 | $Sn(CH_3SO_3)_2$ | 0.5 | $N_2$ | $H_2O$ | solution |
| 977 | 10.34 | $Sn(CH_3SO_3)_2$ | 0.5 | $N_2$ | $H_2O$ | solution |
| 958 | 9.37 | $Sn(CH_3SO_3)_2$ | 0.3 | none | $CH_2Cl_2$ | solution |
| 943 | 6.18 | $Sn(CH_3SO_3)_2$ | 0.1 | none | $N_2/H_2$ | solution |
| 959 | 9.76 | $Sn(CH_3SO_3)_2$ | 0.5 | none | $N_2/H_2$ | solution |
| 955 | 9.41 | $Sn(CH_3SO_3)_2$ | 0.5 | none | $H_2O$ | solution |
| 947 | 9.54 | $Sn(CH_3SO_3)_2$ | 0.8 | none | $H_2O$ | solution |
| 948 | 7.62 | $Sn(CH_3SO_3)_2$ | 0.7 | none | $H_2O$ | solution |
| 973 | 9.96 | $Sn(CH_3SO_3)_2$ | 0.6 | none | $N_2$ | solution |
| 937 | 8.75 | $Sn(CF_3SO_3)_2$ | 0.7 | none | $H_2O$ | solution |
| 937 | 8.81 | $Sn_2P_2O_7$ | 0.5 | none | none | dry |
| 931 | 8.53 | $Sn_2P_2O_7$ | 0.16 | none | none | dry |
| 931 | 6.04 | $Sn_2P_2O_7$ | 0.5 | none | $H_2O$ | solution |
| 961 | 9.46 | $Sn_2P_2O_7$ | 0.1 | none | none | dry |
| 933 | 6.77 | $Sn_2P_2O_7$ | 0.5 | none | $H_2O$ | solution |
| 930 | 7.51 | $Sn_2P_2O_7$ | 0.5 | none | $H_2O$ | solution |
| 960 | 9.03 | $Sn_2P_2O_7$ | 0.95 | none | none | dry |
| 946 | 7.68 | $Sn_2P_2O_7$ | 0.5 | none | none | dry |
| 933 | 8.27 | $Sn_2P_2O_7$ | 0.5 | none | none | dry |
| 931 | 8.12 | $SnBr2$ | 0.5 | none | conc. HCl | solution |
| 936 | 9.07 | $SnC_2O_4$ | 0.01 | none | none | dry |
| 942 | 8.94 | $SnCl_2$ | 0.05 | none | Ethylene glycol | solution |
| 948 | 7.63 | $SnCl_2$ | 0.3 | none | Ethylene glycol | solution |
| 946 | 8.92 | $SnCl_2$ | 0.05 | none | Ethylene glycol | solution |
| 937 | 9.47 | $SnCl_2$ | 0.04 | $SnCl_4$ | none | dry |
| 940 | 9.06 | $SnCl_2$ | 0.04 | $SnCl_4$ | none | dry |
| 936 | 8.65 | $SnCl_2$ | 0.04 | $SnCl_4$ | none | dry |
| 930 | 6.03 | $SnCl_2$ | 0.5 | $SnCl_4$ | $H_2O$/HCl | solution |
| 956 | 9.26 | $SnCl_2$ | 0.04 | $SnCl_4$ | none | dry |

TABLE 1-continued

| Peak Emission Wavelength (nm) | Intensity (Log of Counts per Second) | Tin-containing Compound | Amount of Tin-containing Compound | Other Ingredients | Solvent | Processing Condition |
|---|---|---|---|---|---|---|
| 932 | 8.60 | $SnCl_2$ | 0.4 | Na tartrate | $H_2O$/2M HCl | solution |
| 931 | 8.45 | $SnCl_2$ | 0.4 | none | $H_2O$/2M HCl | solution |
| 937 | 6.99 | $SnCl_2$ | 0.4 | $SnCl_4 \cdot 5H_2O$ | $H_2O$ | solution |
| 931 | 6.23 | $SnCl_2$ | 0.4 | $SnCl_4 \cdot 5H_2O$ | $H_2O$ | solution |
| 911 | 6.76 | $SnCl_2$ | 0.4 | $SnCl_4 \cdot 5H_2O$ | $H_2O$ | solution |
| 958 | 9.27 | $SnCl_2$ | 0.1 | none | $H_2O$ | solution |
| 946 | 9.56 | $SnCl_2$ | 0.1 | none | $H_2O$ | solution |
| 958 | 9.03 | $SnCl_2$ | 0.06 | Na polyphosphate | $H_2O$/2M HCl | solution |
| 964 | 9.52 | $SnCl_2$ | 0.06 | Na polyphosphate | $H_2O$/2M HCl | solution |
| 930 | 8.24 | $SnCl_2$ | 0.3 | Na polystyrene sulfonate | $H_2O$/2M HCl | solution |
| 930 | 8.07 | $SnCl_2$ | 0.3 | p-toluene sulfonic acid | $H_2O$/2M HCl | solution |
| 962 | 7.91 | $SnCl_2$ | 0.3 | p-toluene sulfonic acid | $H_2O$ | solution |
| 930 | 6.63 | $SnCl_2$ | 0.4 | p-toluene sulfonic acid | $H_2O$/2M HCl | solution |
| 937 | 7.49 | $SnCl_2$ | 0.4 | Na polystyrene sulfonate | $H_2O$/2M HCl | solution |
| 942 | 9.82 | $SnCl_2$ | 0.01 | $Mn(CH_3CO_2)_2$ | none | dry |
| 942 | 9.82 | $SnCl_2$ | 0.01 | $Mn(CH_3CO_2)_2$ | none | dry |
| 932 | 8.76 | $SnCl_2$ | 0.01 | $MnSO_4$ | none | dry |
| 932 | 8.76 | $SnCl_2$ | 0.01 | $MnSO_4$ | none | dry |
| 932 | 8.34 | $SnCl_2$ | 0.02 | CuBr | none | dry |
| 932 | 8.34 | $SnCl_2$ | 0.02 | CuBr | none | dry |
| 931 | 7.93 | $SnCl_2$ | 0.33 | Na polyphosphate Na tartrate | $H_2O$/2M HCl | solution |
| 938 | 9.30 | $SnCl_2$ | 0.33 | Na polyphosphate Na tartrate | $H_2O$/2M HCl | solution |
| 936 | 8.56 | $SnCl_2$ | 0.33 | Na polyphosphate Na tartrate | $H_2O$/2M HCl | solution |
| 931 | 8.99 | $SnCl_2$ | 0.33 | Na polyphosphate Na tartrate | $H_2O$/2M HCl | solution |
| 937 | 8.55 | $SnCl_2$ | 0.01 | none | none | dry |
| 944 | 8.66 | $SnCl_2$ | 0.01 | none | none | dry |
| 937 | 8.54 | $SnCl_2$ | 0.12 | $SnCl_4$ | none | dry |
| 931 | 8.82 | $SnCl_2 \cdot 2H_2O$ | 0.01 | none | none | dry |
| 932 | 8.40 | $SnCl_2$ | 0.5 | $SnCl_4 \cdot 5H_2O$ | $H_2O$ | solution |
| 960 | 8.82 | $SnCl_2$ | 0.2 | $SnCl_4 \cdot 5H_2O$ | $H_2O$ | solution |
| 940 | 9.36 | $SnCl_2$ | 0.2 | $SnCl_4 \cdot 5H_2O$ | $H_2O$ | solution |
| 973 | 9.38 | $SnCl_2$ | 0.2 | $SnCl_4 \cdot 5H_2O$ | $H_2O$ | solution |
| 937 | 6.47 | $SnCl_2$ | 0.4 | $SnCl_4 \cdot 5H_2O$ | $H_2O$/2M HCl | solution |
| 930 | 7.78 | $SnF_2$ | 0.2 | none | $H_2O$/2M HCl | solution |
| 937 | 7.51 | $SnF_2$ | 0.1 | none | $H_2O$/2M HCl | solution |
| 936 | 9.04 | $SnF_2$ | 0.3 | none | $H_2O$/2M HCl | solution |
| 930 | 7.30 | $SnF_2$ | 0.4 | none | $H_2O$/2M HCl | solution |
| 936 | 8.04 | $SnF_2$ | 0.5 | none | $H_2O$/2M HCl | solution |
| 930 | 8.91 | $SnF_2$ | 0.6 | none | $H_2O$/2M HCl | solution |
| 943 | 6.87 | $SnF_2$ | 0.7 | none | $H_2O$/2M HCl | solution |
| 937 | 8.95 | $SnF_2$ | 0.15 | Na polyphosphate | $H_2O$/2M HCl | solution |
| 937 | 8.91 | $SnF_2$ | 0.15 | Na tripolyphosphate | $H_2O$/2M HCl | solution |
| 930 | 8.56 | $SnF_2$ | 0.15 | Na polyphosphate | $H_2O$/2M HCl | solution |
| 937 | 9.22 | $SnF_2$ | 0.15 | Na tripolyphosphate | $H_2O$/2M HCl | solution |
| 937 | 9.26 | $SnF_2$ | 0.15 | Na polyphosphate | $H_2O$/2M HCl | solution |
| 930 | 8.88 | $SnF_2$ | 0.15 | Na polyphosphate Na tartrate | $H_2O$/2M HCl | solution |
| 930 | 9.18 | $SnF_2$ | 0.15 | Na polyphosphate Na citrate | $H_2O$/2M HCl | solution |

TABLE 1-continued

| Peak Emission Wavelength (nm) | Intensity (Log of Counts per Second) | Tin-containing Compound | Amount of Tin-containing Compound | Other Ingredients | Solvent | Processing Condition |
|---|---|---|---|---|---|---|
| 930 | 9.00 | $SnF_2$ | 0.15 | Na polyphosphate Na tartrate | $H_2O$/2M HCl | solution |
| 930 | 9.00 | $SnF_2$ | 0.15 | Na polyphosphate Na citrate | $H_2O$/2M HCl | solution |
| 930 | 9.02 | $SnF_2$ | 0.15 | Na polyphosphate Na citrate | $H_2O$/2M HCl | solution |
| 929 | 8.69 | $SnF_2$ | 0.15 | Ascorbic acid | $H_2O$/2M HCl | solution |
| 936 | 8.96 | $SnF_2$ | 0.15 | Ascorbic acid | $H_2O$/2M HCl | solution |
| 929 | 8.45 | $SnF_2$ | 0.15 | Ascorbic acid | $H_2O$/2M HCl | solution |
| 937 | 8.80 | $SnF_2$ | 0.15 | $Na_3PO_4$; Na citrate | $H_2O$/2M HCl | solution |
| 937 | 8.82 | $SnF_2$ | 0.15 | $Na_3PO_4$; Na citrate | $H_2O$/2M HCl | solution |
| 930 | 8.07 | $SnF_2$ | 0.15 | $Na_3PO_4$; Na citrate | $H_2O$/2M HCl | solution |
| 931 | 8.21 | $SnF_2$ | 0.15 | $Na_3PO_4$; Na citrate | $H_2O$/2M HCl | solution |
| 929 | 9.13 | $SnF_2$ | 0.15 | $Na_3PO_4$; Na citrate | $H_2O$/2M HCl | solution |
| 910 | 8.23 | $SnF_2$ | 0.15 | $Na_3PO_4$; Na citrate | $H_2O$/2M HCl | solution |
| 929 | 8.04 | $SnF_2$ | 0.15 | $Na_3PO_4$; Na citrate | $H_2O$/2M HCl | solution |
| 911 | 7.41 | $SnF_2$ | 0.15 | Na tripoly-phosphate | $H_2O$/2M HCl | solution |
| 937 | 9.23 | $SnF_2$ | 0.15 | Na polyphosphate | $H_2O$/2M HCl | solution |
| 930 | 8.92 | $SnF_2$ | 0.15 | Na polyphosphate Na tartrate | $H_2O$/2M HCl | solution |
| 930 | 8.90 | $SnF_2$ | 0.15 | Na polyphosphate Na tartrate | $H_2O$/2M HCl | solution |
| 931 | 8.56 | $SnF_2$ | 0.15 | $Na_2HPO_4$; Li $DodSO_4$ | $H_2O$/2M HCl | solution |
| 930 | 7.51 | $SnF_2$ | 0.15 | $Na_2HPO_4$; Li $DodSO_4$ | $H_2O$/2M HCl | solution |
| 930 | 7.92 | $SnF_2$ | 0.15 | $Na_2HPO_4$; Li $DodSO_4$ | $H_2O$/2M HCl | solution |
| 911 | 7.64 | $SnF_2$ | 0.9 | Na polyphosphate Na tartrate | $H_2O$/2M HCl | solution |
| 911 | 7.64 | $SnF_2$ | 0.9 | Na polyphosphate Na tartrate | $H_2O$/2M HCl | solution |
| 930 | 6.73 | $SnF_2$ | 0.5 | Na polyphosphate Na tartrate | $H_2O$/2M HCl | solution |
| 911 | 6.49 | $SnF_2$ | 0.3 | $Na_2S_2O_5$ | $H_2O$/2M HCl | solution |
| 942 | 8.27 | $SnI_2$ | 0.6 | none | none | dry |
| 938 | 7.36 | $SnI_2$ | 0.3 | none | none | dry |
| 937 | 8.86 | $SnI_2$ | 0.4 | none | none | dry |
| 937 | 8.86 | $SnI_2$ | 0.4 | none | none | dry |
| 942 | 7.77 | $SnI_2$ | 0.6 | none | none | dry |
| 943 | 7.13 | $SnI_2$ | 0.01 | none | none | dry |
| 957 | 7.38 | $SnI_2$ | 0.5 | $Cs(CH_3SO_3)$ | none | dry |
| 959 | 6.30 | $SnI_2$ | 0.5 | none | none | dry |
| 912 | 6.20 | $SnI_2$ | 0.02 | none | none | dry |
| 937 | 7.30 | $SnI_2$ | 0.01 | none | none | dry |
| 931 | 6.68 | SnO | 0.01 | $I_2$ | none | dry |
| 929 | 8.06 | SnO | 0.01 | $H_3PO_4$ | none | dry |
| 929 | 8.04 | $SnP_2O_7$ | 0.01 | none | none | dry |
| 930 | 6.96 | $SnP_2O_7$ | 0.01 | none | none | dry |
| 943 | 9.00 | $SnSO_4$ | 0.01 | none | none | dry |
| 963 | 9.23 | $Sn(CH_3SO_3)_2$ | 0.01 | none | $H_2O$ | solution |
| 944 | 9.13 | $Sn(CH_3SO_3)_2$ | 0.5 | none | $H_2O$ | solution |
| 937 | 8.26 | $Sn(CH_3SO_3)_2$ | 0.5 | none | $H_2O$ | solution |
| 944 | 8.04 | $Sn(CH_3SO_3)_2$ | 0.5 | none | $H_2O$ | solution |
| 930 | 7.42 | $Sn(CH_3SO_3)_2$ | 0.5 | none | $H_2O$ | solution |
| 931 | 7.87 | $Sn(CH_3SO_3)_2$ | 0.67 | none | $H_2O$ | solution |
| 930 | 8.61 | $Sn(CH_3SO_3)_2$ | 0.5 | none | $H_2O$ | solution |

TABLE 1-continued

| Peak Emission Wavelength (nm) | Intensity (Log of Counts per Second) | Tin-containing Compound | Amount of Tin-containing Compound | Other Ingredients | Solvent | Processing Condition |
|---|---|---|---|---|---|---|
| 946 | 8.16 | $Sn(CH_3SO_3)_2$ | 0.5 | none | $H_2O$ | solution |
| 949 | 7.17 | $Sn(CH_3SO_3)_2$ | 0.5 | none | $H_2O$ | solution |
| 929 | 7.75 | $Sn(CH_3SO_3)_2$ | 0.5 | none | $H_2O$ | solution |
| 930 | 7.69 | $Sn(CH_3SO_3)_2$ | 0.5 | none | $H_2O$ | solution |
| 834 | 7.95 | $SnBr_2$ | 0.02 | none | none | dry |
| 842 | 7.85 | $SnBr_2$ | 0.04 | none | none | dry |
| 842 | 8.21 | $SnBr_2$ | 0.15 | none | none | dry |
| 818 | 7.91 | $SnBr_2$ | 0.2 | none | none | dry |
| 875 | 7.45 | $SnBr_2$ | 0.5 | none | none | dry |
| 843 | 6.87 | $SnCl_2$ | 0.01 | none | $H_2O$ | solution |
| 931 | 8.20 | $SnCl_2$ | 0.4 | none | $H_2O$ | solution |
| 931 | 8.34 | $SnCl_2$ | 0.4 | none | $H_2O$ | solution |
| 933 | 7.42 | $SnCl_2$ | 0.04 | none | none | ball milling |
| 933 | 8.55 | $SnCl_2$ | 0.04 | none | none | heat |
| 961 | 8.76 | $SnCl_2$ | 0.04 | none | none | heat |
| 939 | 7.41 | $SnCl_2$ | 0.06 | P123 surfactant | Isopropyl alcohol | solution |
| 940 | 8.20 | $SnCl_2$ | 0.02 | none | none | dry |
| 942 | 7.74 | $SnCl_2$ | 0.02 | P123 surfactant | Isopropyl alcohol | solution |
| 929 | 7.80 | $SnCl_2$ | 0.02 | L-ascorbic acid | Dimethyl formamide | solution |
| 958 | 8.91 | $SnCl_2$ | 0.02 | L-ascorbic acid | Dimethyl formamide | solution |
| 958 | 9.54 | $SnCl_2$ | 0.02 | Paraffin wax | none | dry |
| 958 | 9.53 | $SnCl_2$ | 0.02 | none | none | heat |
| 977 | 9.91 | $SnCl_2$ | 0.03 | none | none | heat |
| 958 | 9.00 | $SnCl_2$ | 0.04 | none | none | heat |
| 946 | 9.47 | $SnCl_2$ | 0.02 | none | none | dry |
| 944 | 7.20 | $SnCl_2$ | 0.02 | DOSS | Isopropyl alcohol | solution |
| 945 | 7.88 | $SnCl_2$ | 0.02 | Tween60 | Isopropyl alcohol | solution |
| 977 | 10.10 | $SnCl_2$ | 0.1 | none | none | heat |
| 955 | 9.76 | $SnCl_2$ | 0.08 | none | none | heat |
| 957 | 9.59 | $SnCl_2$ | 0.03 | L-ascorbic acid | none | heat |
| 961 | 7.86 | $SnCl_2$ | 0.03 | L-ascorbic acid | none | heat |
| 944 | 9.86 | $SnCl_2$ | 0.03 | L-ascorbic acid | none | heat |
| 961 | 9.56 | $SnCl_2$ | 0.03 | L-ascorbic acid | none | heat |
| 980 | 9.78 | $SnCl_2$ | 0.03 | none | none | heat |
| 977 | 10.27 | $SnCl_2$ | 0.03 | none | none | heat |
| 931 | 6.75 | $SnCl_2$ | 0.02 | SDS | $H_2O$ | solution |
| 943 | 8.05 | $SnCl_2$ | 0.02 | DOSS | $H_2O$ | solution |
| 977 | 10.06 | $SnCl_2$ | 0.01 | none | none | heat |
| 977 | 10.24 | $SnCl_2$ | 0.01 | none | none | heat |
| 977 | 10.16 | $SnCl_2$ | 0.01 | none | none | heat |
| 977 | 10.21 | $SnCl_2$ | 0.01 | none | none | heat |
| 978 | 10.19 | $SnCl_2$ | 0.01 | none | none | heat |
| 945 | 8.78 | $SnCl_2$ | 0.05 | Paraffin wax | none | heat |
| 943 | 9.49 | $SnCl_2$ | 0.12 | none | none | heat |
| 948 | 9.91 | $SnCl_2$ | 0.12 | none | none | heat |
| 961 | 9.82 | $SnCl_2$ | 0.16 | none | none | heat |
| 977 | 9.71 | $SnCl_2$ | 0.2 | none | none | heat |
| 977 | 9.80 | $SnCl_2$ | 0.2 | none | none | heat |
| 958 | 9.33 | $SnCl_2$ | 0.03 | Paraffin wax | none | dry |
| 936 | 7.97 | $SnCl_2$ | 0.14 | CTAB | none | dry |
| 936 | 7.99 | $SnCl_2$ | 0.17 | SDS | none | dry |
| 955 | 7.20 | $SnCl_2$ | 0.12 | P123 surfactant | none | dry |
| 946 | 6.21 | $SnCl_2$ | 0.3 | Brij76 surfactant | none | dry |
| 958 | 7.40 | $SnCl_2$ | 0.13 | DOSS | none | dry |
| 958 | 8.02 | $SnCl_2$ | 0.04 | Paraffin wax | none | dry |
| 948 | 8.41 | $SnCl_2$ | 0.04 | $SnO_2$ | none | dry |
| 932 | 6.26 | $SnCl_2$ | 0.05 | DOSS | none | dry |
| 932 | 6.79 | $SnCl_2$ | 0.05 | DOSS | none | dry |
| 935 | 9.15 | $SnCl_2$ | 0.13 | none | none | dry |
| 977 | 9.37 | $SnCl_2$ | 0.12 | none | none | dry |
| 943 | 7.78 | $SnCl_2$ | 0.08 | Polystyrene sulfonate | none | dry |
| 943 | 9.09 | $SnCl_2$ | 0.1 | | none | dry |

TABLE 1-continued

| Peak Emission Wavelength (nm) | Intensity (Log of Counts per Second) | Tin-containing Compound | Amount of Tin-containing Compound | Other Ingredients | Solvent | Processing Condition |
|---|---|---|---|---|---|---|
| 961 | 9.61 | $SnCl_2$ | 0.1 | L-ascorbic acid | none | dry |
| 943 | 8.63 | $SnCl_2$ | 0.12 | none | none | heat |
| 961 | 9.58 | $SnCl_2$ | 0.2 | none | none | heat |
| 930 | 9.03 | $SnCl_2$ | 0.2 | none | none | dry |
| 973 | 9.19 | $SnCl_2$ | 0.1 | none | none | heat |
| 931 | 6.79 | $SnCl_2$ | 0.2 | L-ascorbic acid | none | ball milling |
| 943 | 7.90 | $SnCl_2$ | 0.2 | L-ascorbic acid | none | ball milling |
| 932 | 7.54 | $SnCl_2$ | 0.2 | none | none | ball milling |
| 933 | 9.16 | $SnCl_2$ | 0.2 | none | none | ball milling |
| 943 | 9.94 | $SnCl_2$ | 0.1 | none | none | heat |
| 961 | 8.81 | $SnCl_2$ | 0.16 | Silica (Aldrich) | none | dry |
| 931 | 8.42 | $SnCl_2$ | 0.1 | none | none | jar milling |
| 961 | 9.74 | $SnCl_2$ | 0.05 | none | none | heat |
| 961 | 9.86 | $SnCl_2$ | 0.05 | none | none | heat |
| 931 | 8.27 | $SnCl_2$ | 0.1 | $SnO_2$ | none | dry |
| 931 | 8.79 | $SnCl_2$ | 0.1 | $Al_2O_3$ (Nano Active) | none | dry |
| 930 | 8.66 | $SnCl_2$ | 0.1 | $Al_2O_3$ (Fisher) | none | dry |
| 960 | 8.88 | $SnCl_2$ | 0.1 | $SnO_2$ | none | heat |
| 960 | 9.18 | $SnCl_2$ | 0.1 | $Al_2O_3$ (Nano Active) | none | heat |
| 961 | 10.27 | $SnCl_2$ | 0.1 | $Al_2O_3$ (Fisher) | none | heat |
| 944 | 8.38 | $SnCl_2$ | 0.1 | Silica (EMS) | none | heat |
| 944 | 9.48 | $SnCl_2$ | 0.1 | $TiO_2$ (Nano Active) | none | dry |
| 973 | 9.69 | $SnCl_2$ | 0.1 | $TiO_2$ (Nano Active) | none | dry |
| 931 | 8.10 | $SnCl_2$ | 0.1 | Aminopropyl trimethoxy silane | none | dry |
| 957 | 9.19 | $SnCl_2$ | 0.1 | Aminopropyl trimethoxy silane | none | dry |
| 973 | 10.07 | $SnCl_2$ | 0.1 | $Al_2O_3$ (Fisher) | none | dry |
| 943 | 7.78 | $SnCl_2$ | 0.1 | Tetraethyl orthasilicate | Toluene | solution |
| 961 | 9.68 | $SnCl_2$ | 0.1 | Tetraethyl orthasilicate | Toluene | solution |
| 948 | 9.63 | $SnCl_2$ | 0.1 | Tetraethyl orthasilicate | Toluene | dry |
| 947 | 9.16 | $SnCl_2$ | 0.1 | Tetraethyl orthasilicate | Toluene | dry |
| 940 | 7.75 | $SnCl_2$ | 0.1 | Polymethyl methacrylate-polystyrene | Toluene | dry |
| 973 | 9.98 | $SnCl_2$ | 0.1 | Silica (EMS) | none | dry |
| 977 | 9.86 | $SnCl_2$ | 0.1 | none | none | dry |
| 958 | 9.69 | $SnCl_2$ | 0.1 | Polymethyl methacrylate-polystyrene | Toluene | ultrasonic |
| 945 | 7.29 | $SnCl_2$ | 0.4 | none | $H_2O$ | solution |
| 860 | 7.58 | $SnCl_2$ | 0.5 | none | $H_2O$ | solution |
| 930 | 8.90 | $SnCl_2$ | 0.5 | none | $H_2O$ | solution |
| 930 | 7.43 | $SnCl_2$ | 0.5 | $NaBH_4$ | $H_2O$ | solution |
| 931 | 6.91 | $SnCl_2$ | 0.5 | $NaBH_4$ | $H_2O$ | solution |
| 930 | 8.97 | $SnCl_2$ | 0.5 | none | $H_2O$ | solution |
| 932 | 8.74 | $SnCl_2$ | 0.5 | none | $H_2O$ | solution |
| 930 | 8.30 | $SnCl_2$ | 0.5 | none | $H_2O$ | solution |
| 930 | 8.37 | $SnCl_2$ | 0.5 | none | $H_2O$ | solution |
| 930 | 8.16 | $SnCl_2$ | 0.5 | none | $H_2O$ | solution |
| 966 | 6.18 | $SnCl_2$ | 0.5 | none | Heptane/Isopropyl alcohol | solution |
| 993 | 6.48 | $SnCl_2$ | 0.5 | none | Methanol | solution |
| 929 | 7.73 | $SnCl_2$ | 0.5 | none | Methanol | solution |
| 868 | 6.90 | $SnCl_2$ | 0.5 | none | Methanol | solution |
| 942 | 8.34 | $SnCl_2$ | 0.5 | none | $H_2O$ | solution |
| 943 | 9.24 | $SnCl_2$ | 0.5 | none | $H_2O$ | solution |
| 932 | 8.17 | $SnCl_2$ | 0.5 | none | $H_2O$ | solution |
| 931 | 7.16 | $SnCl_2$ | 0.5 | none | $H_2O$ | solution |
| 940 | 8.29 | $SnCl_2$ | 0.5 | none | $H_2O$ | solution |

TABLE 1-continued

| Peak Emission Wavelength (nm) | Intensity (Log of Counts per Second) | Tin-containing Compound | Amount of Tin-containing Compound | Other Ingredients | Solvent | Processing Condition |
|---|---|---|---|---|---|---|
| 929 | 7.95 | $SnCl_2$ | 0.5 | none | $H_2O$ | solution |
| 930 | 8.47 | $SnCl_2$ | 0.5 | none | $H_2O$ | solution |
| 931 | 6.94 | $SnCl_2$ | 0.5 | none | $H_2O$ | solution |
| 931 | 8.02 | $SnCl_2$ | 0.5 | none | $H_2O$ | solution |
| 930 | 7.76 | $SnCl_2$ | 0.5 | none | $H_2O$ | solution |
| 930 | 7.18 | $SnCl_2$ | 0.5 | none | $H_2O$ | solution |
| 942 | 8.48 | $SnCl_2$ | 0.5 | none | none | solution |
| 945 | 8.30 | $SnCl_2$ | 0.5 | none | Methanol | solution |
| 939 | 6.52 | $SnCl_2$ | 0.5 | none | $H_2O$ | solution |
| 930 | 8.77 | $SnCl_2$ | 0.5 | none | $H_2O$ | solution |
| 913 | 8.35 | $SnCl_2$ | 0.5 | none | Dimethyl formamide | solution |
| 886 | 6.98 | $SnCl_2$ | 0.5 | none | Dimethyl formamide | solution |
| 930 | 8.38 | $SnCl_2$ | 0.5 | none | Methanol 10 mL | solution |
| 937 | 8.51 | $SnCl_2$ | 0.5 | none | Methanol 5 mL | solution |
| 929 | 7.72 | $SnCl_2$ | 0.67 | none | $H_2O$ | solution |
| 945 | 8.97 | $SnCl_2$ | 0.33 | none | $H_2O$ | solution |
| 931 | 8.05 | $SnCl_2$ | 0.9 | none | $H_2O$ | solution |
| 945 | 7.85 | $SnCl_2$ | 0.1 | none | $H_2O$ | solution |
| 906 | 7.02 | $SnCl_2$ | 0.5 | none | Dimethyl formamide | solution |
| 957 | 9.59 | $SnCl_2$ | 0.2 | none | none | heat |
| 944 | 8.77 | $SnCl_2$ | 0.2 | none | none | heat |
| 944 | 9.08 | $SnCl_2$ | 0.2 | none | none | heat |
| 944 | 8.83 | $SnCl_2$ | 0.2 | none | none | heat |
| 944 | 9.18 | $SnCl_2$ | 0.2 | none | none | heat |
| 962 | 9.34 | $SnCl_2$ | 0.2 | none | none | heat |
| 964 | 9.57 | $SnCl_2$ | 0.2 | none | none | heat |
| 964 | 9.91 | $SnCl_2$ | 0.2 | none | none | heat |
| 964 | 9.87 | $SnCl_2$ | 0.2 | none | none | heat |
| 943 | 9.26 | $SnCl_2$ | 0.2 | none | none | heat |
| 931 | 8.13 | $SnCl_2$ | 0.2 | none | Dimethyl formamide | dry |
| 944 | 9.54 | $SnCl_2$ | 0.1 | none | none | heat |
| 958 | 9.79 | $SnCl_2$ | 0.05 | none | none | heat |
| 958 | 9.74 | $SnCl_2$ | 0.03 | none | none | heat |
| 964 | 9.90 | $SnCl_2$ | 0.005 | none | none | heat |
| 958 | 9.73 | $SnCl_2$ | 0.5 | none | none | heat |
| 957 | 9.40 | $SnCl_2$ | 0.02 | none | none | heat 150° C. |
| 944 | 9.07 | $SnCl_2$ | 0.02 | none | none | heat 100° C. |
| 944 | 9.27 | $SnCl_2$ | 0.02 | none | none | heat 125° C. |
| 945 | 9.66 | $SnCl_2$ | 0.02 | none | none | heat 125° C. |
| 944 | 9.60 | $SnCl_2$ | 0.02 | none | none | heat 100° C. |
| 944 | 9.30 | $SnCl_2$ | 0.02 | none | none | heat 100° C. |
| 944 | 9.65 | $SnCl_2$ | 0.02 | none | none | heat 150° C. |
| 958 | 9.58 | $SnCl_2$ | 0.02 | none | none | heat 150° C. |
| 957 | 9.41 | $SnCl_2$ | 0.02 | none | none | heat 150° C. |
| 958 | 9.46 | $SnCl_2$ | 0.02 | none | none | heat 125° C. |
| 944 | 9.08 | $SnCl_2$ | 0.1 | none | none | heat 100° C. |
| 964 | 9.57 | $SnCl_2$ | 0.01 | none | none | heat 100° C. |
| 958 | 9.59 | $SnCl_2$ | 0.01 | none | none | heat 150° C. |
| 957 | 9.53 | $SnCl_2$ | 0.01 | none | none | heat 150° C. |
| 955 | 9.12 | $SnCl_2$ | 0.01 | none | none | heat 150° C. |
| 958 | 9.50 | $SnCl_2$ | 0.01 | none | none | heat 125° C. |
| 964 | 9.83 | $SnCl_2$ | 0.01 | none | none | heat 125° C. |
| 958 | 9.47 | $SnCl_2$ | 0.01 | none | none | heat 150° C. |
| 957 | 9.46 | $SnCl_2$ | 0.01 | none | none | heat 150° C. |
| 957 | 9.76 | $SnCl_2$ | 0.1 | none | none | heat 150° C. |
| 958 | 8.90 | $SnCl_2$ | 0.1 | none | none | heat 150° C. |
| 958 | 9.28 | $SnCl_2$ | 0.1 | none | none | heat 150° C. |
| 955 | 9.69 | $SnCl_2$ | 0.1 | none | none | heat 150° C. |
| 948 | 9.09 | $SnCl_2$ | 0.1 | none | none | heat 150° C. |
| 942 | 9.42 | $SnCl_2$ | 0.1 | none | none | heat 150° C. |
| 959 | 9.71 | $SnCl_2$ | 0.1 | none | none | heat 150° C. |
| 955 | 9.58 | $SnCl_2$ | 0.1 | none | none | heat 150° C. |
| 958 | 9.58 | $SnCl_2$ | 0.1 | none | none | heat 150° C. |
| 930 | 7.10 | $SnCl_4$ | 0.5 | $NaBH_4$, reduction | $H_2O$ | solution |
| 929 | 7.23 | $SnI_4$ | 0.5 | none | none | dry |
| 929 | 6.85 | $SnI_2$ | 0.5 | none | none | dry |
| 944 | 8.19 | $SnI_2$ | 0.5 | none | none | dry |
| 930 | 6.64 | $SnI_2$ | 0.02 | none | none | dry |
| 880 | 6.54 | $SnI_2$ | 0.2 | none | none | dry |

TABLE 1-continued

| Peak Emission Wavelength (nm) | Intensity (Log of Counts per Second) | Tin-containing Compound | Amount of Tin-containing Compound | Other Ingredients | Solvent | Processing Condition |
|---|---|---|---|---|---|---|
| 930 | 7.50 | SnI$_2$ | 0.3 | none | none | dry |
| 931 | 7.27 | SnI$_2$ | 0.5 | none | none | dry |
| 945 | 7.91 | SnI$_2$ | 0.05 | none | none | heat |
| 944 | 8.26 | SnI$_2$ | 0.05 | none | none | heat |
| 944 | 8.53 | SnI$_2$ | 0.05 | none | none | heat |
| 944 | 8.69 | SnI$_2$ | 0.1 | none | none | photo |
| 944 | 8.78 | SnI$_2$ | 0.1 | none | none | photo |
| 944 | 8.20 | SnI$_2$ | 0.05 | none | none | heat |
| 945 | 8.48 | SnI$_2$ | 0.05 | none | none | heat |
| 931 | 8.68 | SnI$_2$ | 0.05 | none | none | heat |
| 943 | 6.88 | SnI$_2$ | 0.1 | none | Dimethyl formamide | heat |
| 940 | 8.39 | SnI$_2$ | 0.05 | none | none | heat |
| 932 | 8.85 | SnI$_2$ | 0.05 | none | none | heat |
| 944 | 7.85 | SnI$_2$ | 0.05 | none | none | heat 300° C. |
| 944 | 8.59 | SnI$_2$ | 0.05 | none | none | heat 300° C. |
| 944 | 8.68 | SnI$_2$ | 0.05 | none | none | heat 300° C. |
| 944 | 8.58 | SnI$_2$ | 0.05 | none | none | heat 300° C. |
| 945 | 8.00 | SnI$_2$ | 0.05 | none | none | heat 300° C. |
| 945 | 8.54 | SnI$_2$ | 0.05 | none | none | heat 300° C. |
| 938 | 7.90 | SnI$_2$ | 0.05 | none | none | heat 300° C. |
| 941 | 8.11 | SnI$_2$ | 0.05 | none | none | heat 300° C. |
| 940 | 7.80 | SnI$_2$ | 0.05 | none | none | heat 300° C. |
| 936 | 8.29 | SnI$_2$ | 0.05 | none | none | heat 300° C. |
| 955 | 8.95 | Sn(CH$_3$SO$_3$)$_2$ | 0.5 | none | H$_2$O | solution; ball milling |
| 957 | 9.25 | Sn(CH$_3$SO$_3$)$_2$ | 0.5 | none | H$_2$O | solution; ball milling |
| 961 | 9.73 | Sn(CH$_3$SO$_3$)$_2$ | 0.5 | none | H$_2$O | solution; ball milling |
| 944 | 8.13 | Sn(CH$_3$SO$_3$)$_2$ | 0.5 | Xylene | H$_2$O | solution; ball milling |
| 961 | 7.99 | Sn(CH$_3$SO$_3$)$_2$ | 0.5 | Docosane/Polyethylene (1:2) | H$_2$O | solution; ball milling |
| 980 | 8.81 | Sn(CH$_3$SO$_3$)$_2$ | 0.5 | Na dodecyl sulfate | H$_2$O | solution; ball milling |
| 977 | 8.78 | Sn(CH$_3$SO$_3$)$_2$ | 0.5 | Polymethyl methacrylate | H$_2$O | solution; ball milling |
| 931 | 8.25 | Sn(CH$_3$SO$_3$)$_2$ | 0.5 | CaCO$_3$ | H$_2$O | solution; ball milling |
| 943 | 8.59 | Sn(CH$_3$SO$_3$)$_2$ | 0.5 | 2,6-Di-tert-butyl-4-methyl pyridine | H$_2$O | solution; ball milling |
| 977 | 8.32 | Sn(CH$_3$SO$_3$)$_2$ | 0.5 | 1,8-Bis(dimethyl amino) naphthalene | H$_2$O | solution; ball milling |
| 977 | 9.05 | Sn(CH$_3$SO$_3$)$_2$ | 0.5 | Ascorbic acid | H$_2$O | solution; ball milling |
| 977 | 8.74 | Sn(CH$_3$SO$_3$)$_2$ | 0.5 | Ascorbic acid | H$_2$O | solution; ball milling |
| 977 | 8.15 | Sn(CH$_3$SO$_3$)$_2$ | 0.5 | Na$_2$S$_2$O$_5$ | H$_2$O | solution; ball milling |
| 978 | 8.42 | Sn(CH$_3$SO$_3$)$_2$ | 0.5 | Na$_2$SO$_3$ | H$_2$O | solution; ball milling |
| 945 | 8.62 | Sn(CH$_3$SO$_3$)$_2$ | 0.5 | Na$_2$S$_2$O$_4$ | H$_2$O | solution; ball milling |
| 943 | 7.64 | Sn(CH$_3$SO$_3$)$_2$ | 0.5 | Ascorbic acid | H$_2$O | solution; ball milling |
| 948 | 9.32 | Sn(CH$_3$SO$_3$)$_2$ | 0.5 | Hydroquinone | H$_2$O | solution; ball milling |
| 961 | 8.31 | Sn(CH$_3$SO$_3$)$_2$ | 0.5 | D-(+)-Glucose | H$_2$O | solution; ball milling |
| 977 | 9.32 | Sn(CH$_3$SO$_3$)$_2$ | 0.5 | L-cysteine | H$_2$O | solution; ball milling |
| 977 | 9.60 | Sn(CH$_3$SO$_3$)$_2$ | 0.5 | Ascorbic acid | H$_2$O | solution; ball milling |
| 958 | 8.92 | Sn(CH$_3$SO$_3$)$_2$ | 0.5 | Ascorbic acid | H$_2$O | solution; ball milling |
| 936 | 9.08 | Sn(CH$_3$SO$_3$)$_2$ | 0.5 | Ascorbic acid | H$_2$O | solution; ball milling |
| 936 | 9.04 | Sn(CH$_3$SO$_3$)$_2$ | 0.5 | Toluene | H$_2$O | solution; ball milling |

TABLE 1-continued

| Peak Emission Wavelength (nm) | Intensity (Log of Counts per Second) | Tin-containing Compound | Amount of Tin-containing Compound | Other Ingredients | Solvent | Processing Condition |
|---|---|---|---|---|---|---|
| 955 | 8.83 | Sn(CH$_3$SO$_3$)$_2$ | 0.5 | Cathecol | H$_2$O | solution; ball milling |
| 946 | 8.88 | Sn(CH$_3$SO$_3$)$_2$ | 0.5 | Polymethyl methacrylic acid | H$_2$O | solution; ball milling |
| 958 | 9.73 | Sn(CH$_3$SO$_3$)$_2$ | 0.5 | Stearic acid | H$_2$O | solution; ball milling |
| 958 | 9.08 | Sn(CH$_3$SO$_3$)$_2$ | 0.5 | Ascorbic acid | H$_2$O | solution; ball milling |
| 948 | 9.31 | Sn(CH$_3$SO$_3$)$_2$ | 0.5 | Ascorbic acid | H$_2$O | solution; ball milling |
| 932 | 9.33 | Sn(CH$_3$SO$_3$)$_2$ | 0.5 | Ascorbic acid | H$_2$O | solution; ball milling |
| 932 | 9.14 | Sn(CH$_3$SO$_3$)$_2$ | 0.5 | Ascorbic acid | H$_2$O | solution; ball milling |
| 935 | 8.76 | Sn(CH$_3$SO$_3$)$_2$ | 0.5 | Ascorbic acid | H$_2$O | solution; ball milling |
| 977 | 9.03 | Sn(CH$_3$SO$_3$)$_2$ | 0.5 | Ascorbic acid | H$_2$O | solution; ball milling |
| 943 | 10.18 | Sn(CH$_3$SO$_3$)$_2$ | 0.5 | none | H$_2$O | ball milling; heat |
| 943 | 8.96 | Sn(CH$_3$SO$_3$)$_2$ | 0.5 | Citric acid | H$_2$O | solution; ball milling |
| 961 | 9.21 | Sn(CH$_3$SO$_3$)$_2$ | 0.5 | Dodecanoic acid | H$_2$O | solution; ball milling |
| 943 | 9.15 | Sn(CH$_3$SO$_3$)$_2$ | 0.5 | Benzoic acid | H$_2$O | solution; ball milling; |
| 961 | 9.68 | Sn(CH$_3$SO$_3$)$_2$ | 0.5 | none | H$_2$O | ball milling; heat |
| 930 | 10.33 | Sn(CH$_3$SO$_3$)$_2$ | 0.5 | none | H$_2$O | ball milling; heat |
| 973 | 10.17 | Sn(CH$_3$SO$_3$)$_2$ | 0.5 | none | H$_2$O | ball milling; heat |
| 931 | 9.64 | Sn(CH$_3$SO$_3$)$_2$ | 0.5 | none | H$_2$O | ball milling; heat |
| 943 | 9.39 | Sn(CH$_3$SO$_3$)$_2$ | 0.5 | Poly(4-vinylphenol | H$_2$O | solution; ball milling |
| 932 | 8.96 | Sn(CH$_3$SO$_3$)$_2$ | 0.5 | 4-benzoyl butyric acid | H$_2$O | solution; ball milling |
| 933 | 9.04 | Sn(CH$_3$SO$_3$)$_2$ | 0.5 | Hydroquinone | H$_2$O | solution; ball milling |
| 943 | 9.94 | Sn(CH$_3$SO$_3$)$_2$ | 0.5 | none | H$_2$O | ball milling; heat |
| 961 | 10.05 | Sn(CH$_3$SO$_3$)$_2$ | 0.5 | none | H$_2$O | ball milling; heat |
| 931 | 9.65 | Sn(CH$_3$SO$_3$)$_2$ | 0.5 | none | H$_2$O | ball milling; heat |
| 961 | 9.62 | Sn(CH$_3$SO$_3$)$_2$ | 0.5 | none | H$_2$O | ball milling; heat |
| 961 | 9.09 | Sn(CH$_3$SO$_3$)$_2$ | 0.5 | Ascorbic acid | H$_2$O | solution; ball milling |
| 931 | 9.09 | Sn(CH$_3$SO$_3$)$_2$ | 0.5 | Ascorbic acid | H$_2$O | solution; ball milling |
| 931 | 8.37 | Sn(CH$_3$SO$_3$)$_2$ | 0.5 | Ascorbic acid | H$_2$O | solution; ball milling |
| 930 | 9.65 | Sn(CH$_3$SO$_3$)$_2$ | 0.5 | Solsperse 13940 | H$_2$O | solution; ball milling |
| 960 | 9.63 | Sn(CH$_3$SO$_3$)$_2$ | 0.5 | Solsperse 13650 | H$_2$O | solution; ball milling |
| 960 | 9.57 | Sn(CH$_3$SO$_3$)$_2$ | 0.5 | Solsperse 36000 | H$_2$O | solution; ball milling |
| 961 | 9.22 | Sn(CH$_3$SO$_3$)$_2$ | 0.5 | Poly(vinyl butyral) | H$_2$O | solution; ball milling |
| 944 | 9.91 | Sn(CH$_3$SO$_3$)$_2$ | 0.5 | Poly(methyl methacrylate) | H$_2$O | solution; ball milling |
| 944 | 8.80 | Sn$_2$P$_2$O$_7$ | 0.5 | none | none | ball milling; heat |
| 973 | 7.78 | Sn$_2$P$_2$O$_7$ | 0.5 | none | none | ball milling; heat |
| 931 | 8.12 | Sn$_2$P$_2$O$_7$ | 0.5 | none | none | ball milling; heat |
| 957 | 9.33 | Sn$_2$P$_2$O$_7$ | 0.5 | none | none | ball milling; heat |

TABLE 1-continued

| Peak Emission Wavelength (nm) | Intensity (Log of Counts per Second) | Tin-containing Compound | Amount of Tin-containing Compound | Other Ingredients | Solvent | Processing Condition |
|---|---|---|---|---|---|---|
| 973 | 7.56 | $Sn_x(PO_3)_y$ | 0.5 | none | none | ball milling; heat |
| 931 | 7.54 | $SnCl_2$ | 0.5 | $SnCl_4 \cdot 5H2O$ | $H_2O$ | solution |
| 948 | 7.56 | $SnCl_2$ | 0.5 | $SnCl_4 \cdot 5H2O$ | $H_2O$ | solution |
| 911 | 7.80 | $Sn_2P_2O_7$ | 0.5 | none | none | jar milling |
| 929 | 8.02 | $Sn_2P_2O_7$ | 0.5 | none | none | jar milling |
| 930 | 8.21 | $Sn_2P_2O_7$ | 0.5 | none | none | jar milling |
| 939 | 8.54 | SnCsIMyO | 0.5 | none | none | jar milling |
| 931 | 8.56 | $SnCl_2$ | 0.5 | none | none | jar milling |
| 936 | 8.68 | $Sn_2P_2O_7$ | 0.5 | none | none | jar milling |
| 947 | 8.82 | SnCsIMyO | 0.5 | none | none | jar milling |

Example 15

Formation of Luminescent Material

A variety of indium halides were mixed with cesium(I) halides to form colored materials, which were then tested for photoluminescence. The indium halides included InI, InBr, InCl, $InCl_2$, and the cesium(I) halides included CsI, CsBr, and CsCl.

Example 16

Formation and Characterization of Luminescent Material

A variety of indium halides were mixed with CsI to form colored materials, which were then tested for photoluminescence. The indium halides included InI, and a weight fraction of each indium halide with respect to a total weight was in the range of 0.01 to 0.8. The resulting materials were observed to emit light in the range of about 700 nm to about 715 nm. Heating during formation of the resulting materials was observed to increase the intensity of emitted light. In some instances, heating was performed in a nitrogen atmosphere at a temperature of about 225° C. for a time period of about 2 hours.

Example 17

Formation and Characterization of Luminescent Material

A variety of silver-containing compounds, bismuth-containing compounds, copper-containing compounds, germanium-containing compounds, indium-containing compounds, tin-containing compounds, and vanadium-containing compounds were mixed with alkali halides. The resulting materials were then tested for photoluminescence using an excitation wavelength of 532 nm or an excitation wavelength in the ultraviolet range. Table 2 below sets forth ingredients and processing conditions that were used along with photoluminescent characteristics of the resulting materials. As can be appreciated with reference to Table 2, photoluminescent characteristics were observed to vary as a result of using different ingredients and processing conditions. For example, in the case of tin(II) compounds, a peak emission wavelength was observed to correlate with a type of metal included in the alkali halides, with the order of increasing emission wavelength corresponding to potassium, rubidium, and cesium.

TABLE 2

| Peak Emission Wavelength (nm) | Excitation Wavelength (nm) | Ingredient 1 | Ingredient 2 | Processing Condition (° C.) |
|---|---|---|---|---|
| 670 | 532 | $AgNO_3$ | CsI | 25 |
| ~500 | Ultraviolet | $AgNO_3$ | CsI | 25 |
| 650 | 532 | $BiAc_2$ | CsI | 25 |
| 680 | 532 | $BiBr_3$ | CsI | 185 |
| 650 | 532 | $BiCl_3$ | CsI | 200 |
| 637 | 532 | BiOCl | CsI | 400 |
| 468 | Ultraviolet | CuBr | CsI | 25 |
| 468 | Ultraviolet | CuBr | CsI | 25 |
| 446 | Ultraviolet | CuBr | CsI | 350 |
| 450 | Ultraviolet | CuSCN | CsI | 25 |
| 680 | 532 | CuSCN | CsI | 350 |
| 737 | 532 | $GeI_2$ | CsI | 125 |
| 1,330 | 532 | $GeI_2$ | CsI | 125 |
| 727 | 532 | $GeI_2/GeI_4$ | CsI | 25 |
| 1,330 | 532 | $GeI_2/GeI_4$ | CsI | 25 |
| 650 | 532 | InBr | CsBr | 25 |
| ~500 | 532 | InBr | CsCl | 25 |
| 650 | 532 | InBr | CsBr | 225 |
| 485 | Ultraviolet | InBr/CuBr | CsBr | 25 |
| 810 | 532 | InBr/CuBr | CsBr | 25 |
| 710 | 532 | InCl | CsI | 25 |
| 1,445 | 532 | InCl | CsI | 25 |
| 704 | 532 | InCl | CsI | 190 |
| 640 | 532 | InCl | CsBr | 190 |
| 640 | 532 | InCl | CsCl | 190 |
| 640 | 532 | $InCl_2$ | CsBr | 25 |
| 640 | 532 | $InCl_2$ | CsBr | 225 |
| 780 | 532 | $InCl_2$ | CsBr | 200 |
| 680 | 532 | $InCl_2/Sn_2P_2O_7$ | CsBr | 25 |
| 660 | 532 | $InCl_2/Sn_2P_2O_7$ | CsBr | 200 |
| 650 | 532 | $InCl_2/SnCl_4$ | CsBr | 50 |
| 880 | 532 | $InCl_2/SnI_2$ | CsBr | 25 |
| 700 | 532 | $InCl_2/GeI_4$ | CsBr | 25 |
| 1340 | 532 | $InCl_2/GeI_4$ | CsBr | 25 |
| 706 | 532 | InI | CsI | 225 |
| 420 | Ultraviolet | InI/CuBr | CsI | 25 (Ball Milling) |
| 700 | 532 | InI/CuBr | CsI | 25 (Ball Milling) |
| 550 | Ultraviolet | InI/CuBr | CsI | 225 |
| 700 | 532 | InI/CuBr | CsI | 225 |
| 550 | Ultraviolet | $InI/Sn_2P_2O_7$ | CsI | 225 |
| 920 | 532 | $InI/Sn_2P_2O_7$ | CsI | 225 |
| 704 | 532 | $InI/SnCl_2$ | CsI | 225 |
| 930 | 532 | $InI/SnCl_2$ | CsI | 225 |
| 930 | 532 | $InI/SnCl_2$ | CsI | 25 (Ball Milling) |
| 940 | 532 | $InI_2/SnI_2$ | CsI | 25 |
| 700 | 532 | $Sn(CH_3SO_3)_2$ | CsBr | 25 (Solution) |
| 625 | 532 | $SnCl_2$ | KI | 25 |
| 680 | 532 | $SnCl_2$ | RbI | 25 |

TABLE 2-continued

| Peak Emission Wavelength (nm) | Excitation Wavelength (nm) | Ingredient 1 | Ingredient 2 | Processing Condition (° C.) |
|---|---|---|---|---|
| 550 | 532 | $SnF_2$ | KCl | 25 |
| 625 | 532 | $SnF_2$ | KI | 25 |
| 680 | 532 | $SnI_2$ | RbI | 25 |
| 725 | 532 | $VCl_3$ | CsBr | 25 |
| 880 | 532 | $VCl_3$ | CsI | 25 |

Example 18

Characterization of Luminescent Material

A luminescent material was prepared by mixing a tin(II) compound with CsI, and optical characteristics of the luminescent material were measured in accordance with standard techniques.

Figure 4:
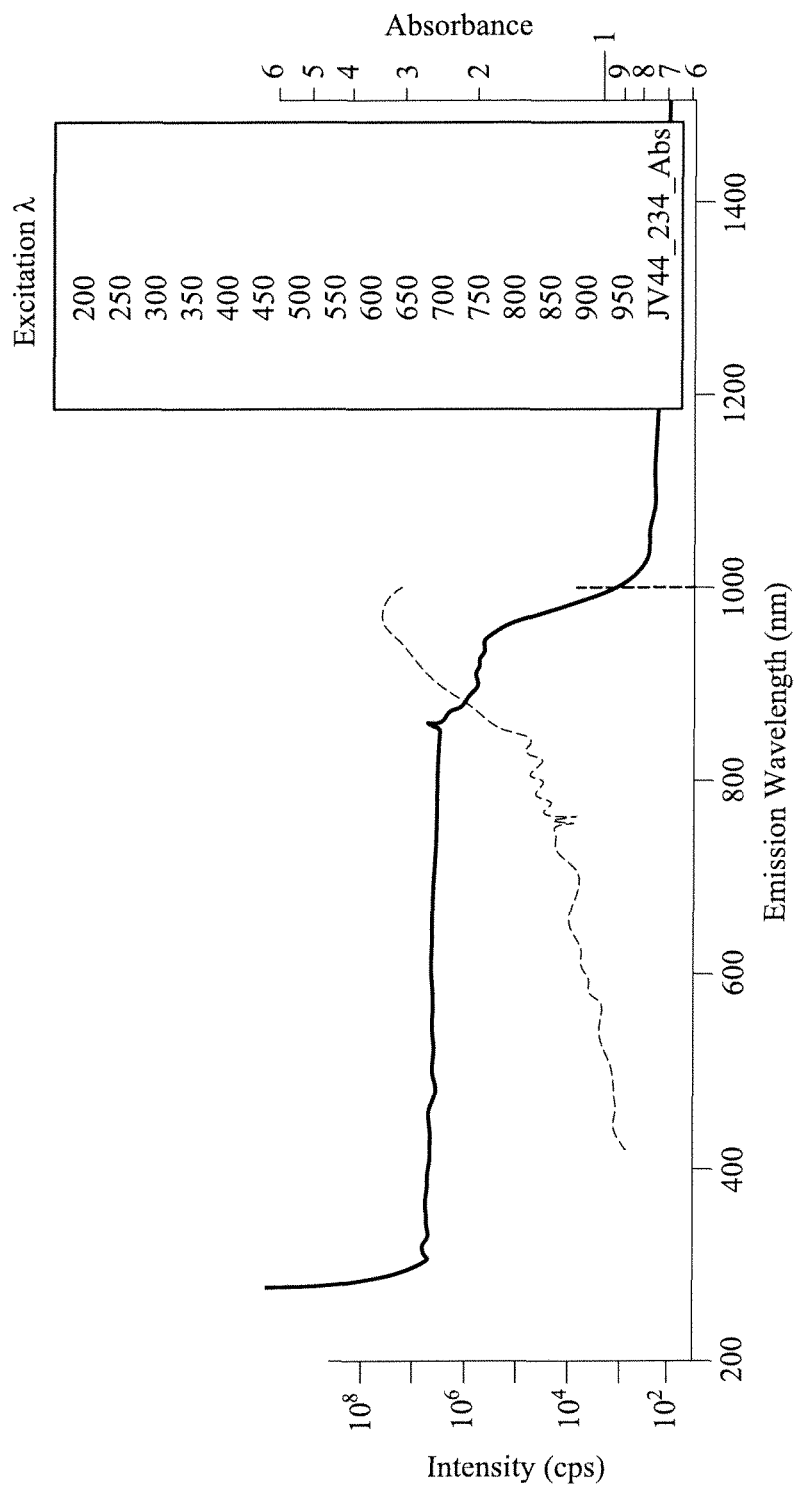
FIG. 4 illustrates emission spectra of a luminescent material for a range of excitation wavelengths, according to an embodiment of the invention.
Figure 5:
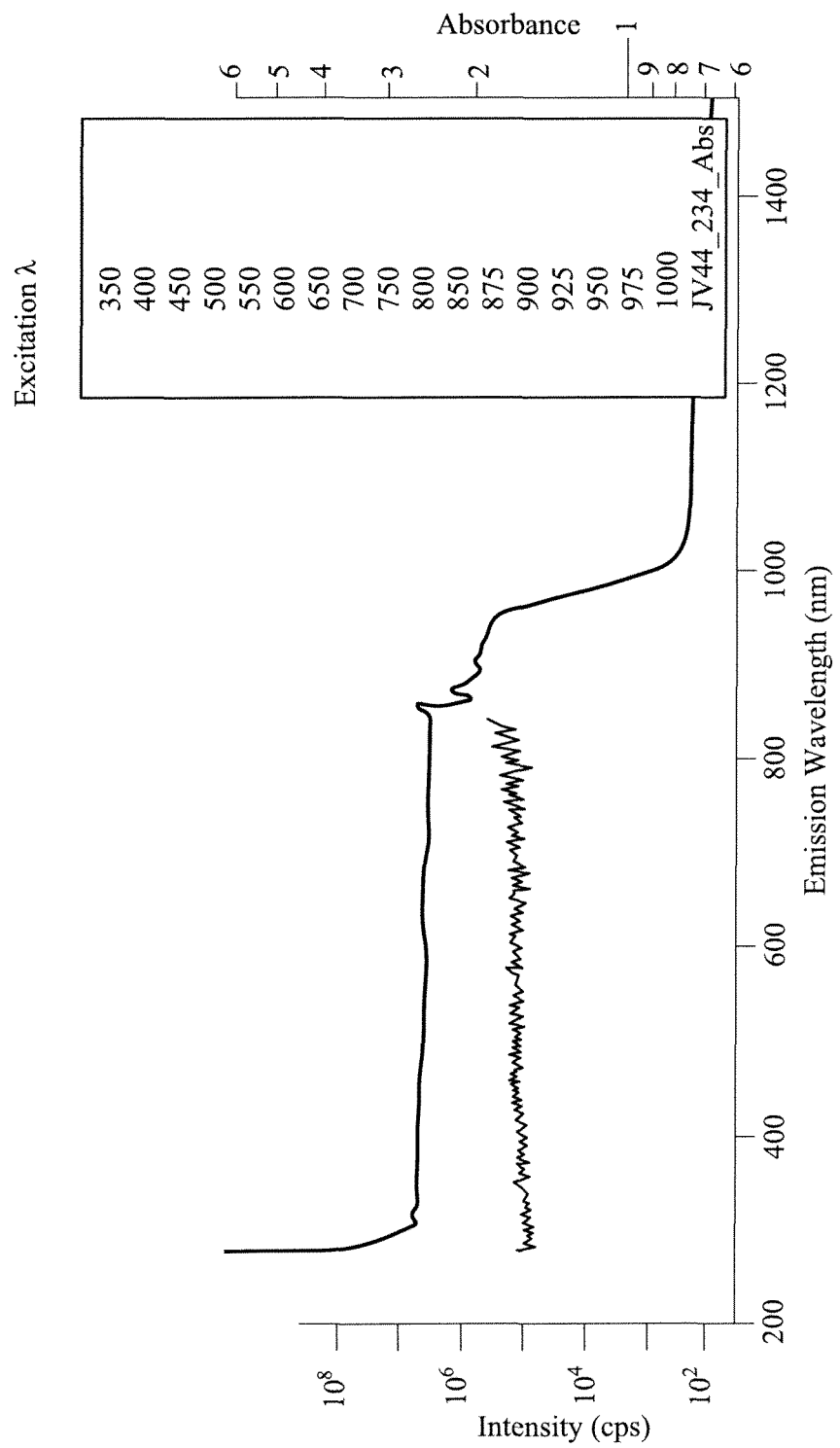
FIG. 5 illustrates an excitation spectrum of a luminescent material, according to an embodiment of the invention.

In particular, photoluminescent characteristics were measured using an experimental setup that included a light source and a pair of spectrometers. A first one of the spectrometers was used to characterize light incident upon the luminescent material, while a second one of the spectrometers was used to characterize light emitted by the luminescent material. FIG. 4 illustrates emission spectra that were obtained for a range of excitation wavelengths. As can be appreciated with reference to FIG. 4, the luminescent material emitted light with high intensities, with a narrow spectral width of less than about 100 nm at FWHM, and with a peak emission wavelength in the range of about 930 nm to about 980 nm. Also, these photoluminescent characteristics were relatively insensitive to changes in excitation wavelength in the range of about 200 nm to about 950 nm. This insensitivity can be further appreciated with reference to FIG. 5, which illustrates an excitation spectrum of the luminescent material. Referring to FIG. 5, the excitation spectrum is substantially flat for excitation wavelengths in the range of about 200 nm to about 980 nm.

Absorption characteristics of the luminescent material were also measured in accordance with standard techniques. In particular, an absorption spectrum of the luminescent material was obtained and is superimposed onto the spectra illustrated in FIG. 4 and FIG. 5.

Example 19

Characterization of Luminescent Material

Figure 6:
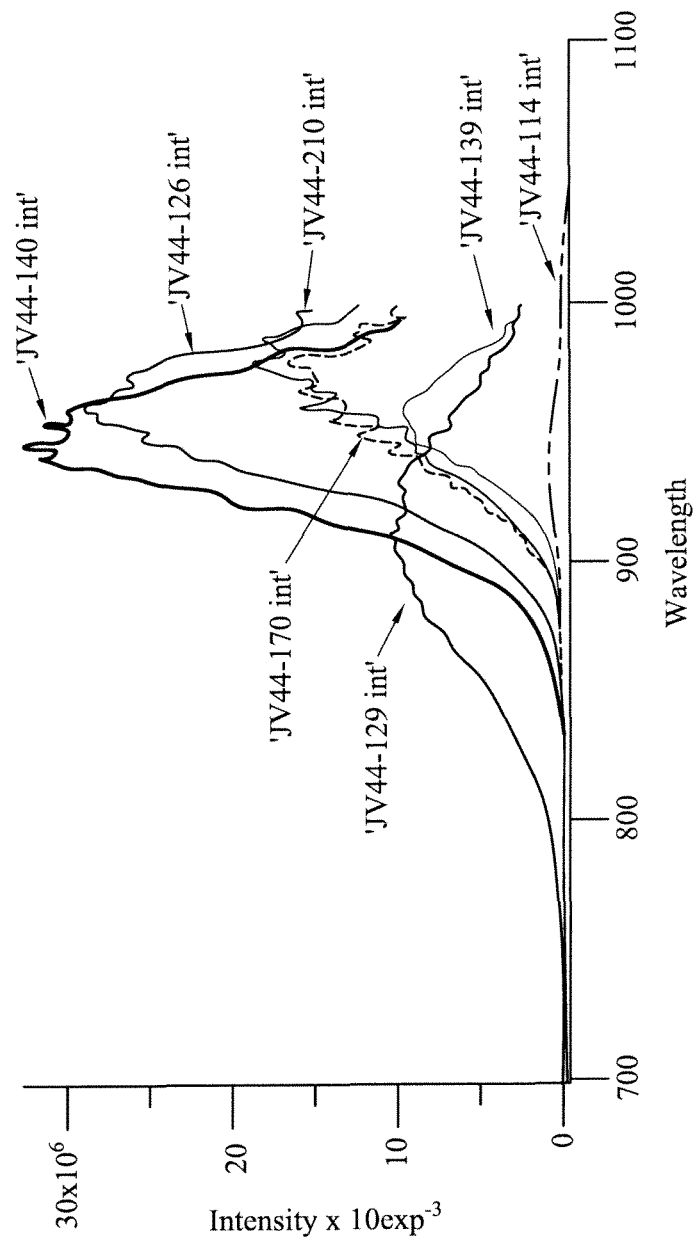
FIG. 6 illustrates emission spectra of a set of luminescent materials, according to an embodiment of the invention.
Figure 7:
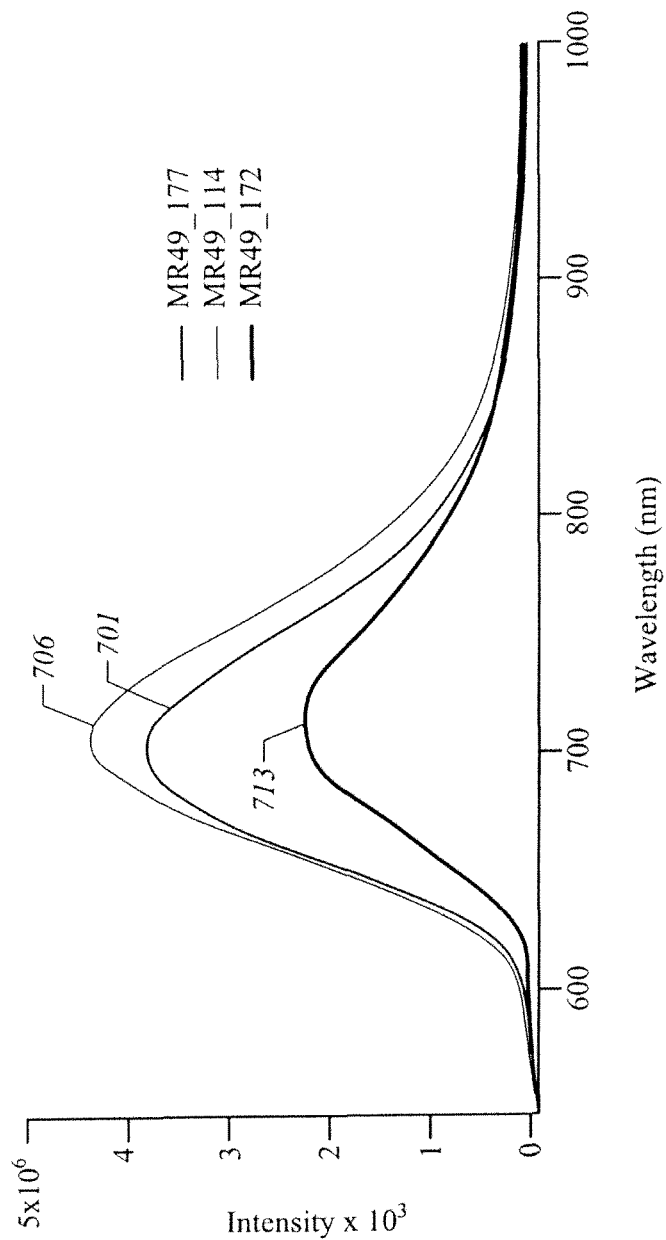
FIG. 7 illustrates emission spectra of another set of luminescent materials, according to an embodiment of the invention.

Luminescent materials were formed using a variety of ingredients and mixing techniques, and photoluminescent characteristics of those materials were measured in a similar manner as described above for Example 15. FIG. 6 illustrates emission spectra that were obtained for a subset of those materials. As can be appreciated with reference to FIG. 6, photoluminescent characteristics were readily tuned to desirable levels by adjusting ingredients and mixing techniques that were used. In particular, a peak emission wavelength was readily tuned so as to be in the range of about 910 nm to about 980 nm. FIG. 7 illustrates emission spectra that were obtained for another subset of those materials. As can be appreciated with reference to FIG. 7, a peak emission wavelength was readily tuned so as to be in the range of about 701 nm to about 713 nm.

Example 20

Formation of Ink Composition

A melt mixture of polyethylene and docosane was prepared with a 2 to 1 weight ratio of polyethylene to docosane. Nanoparticles formed of a luminescent material were added to the melt mixture with the ratio of the nanoparticles to the melt mixture in the range of 1 part by weight per 1,000 parts by weight up to equal parts by weight, such as 1 part by weight of the nanoparticles per 2 parts by weight of the melt mixture. The resulting ink composition was then applied to a piece of paper using a standard coating or printing technique.

Example 21

Formation and Characterization of Luminescent Material

Luminescent materials were prepared using a vacuum deposition system. The luminescent materials were formed as films on substrates, such as 25 mm square borosilicate glass slides. In particular, reagent grade $SnCl_2$ was placed in a first bell jar thermal evaporator boat, and reagent grade CsI was placed in a second thermal evaporator boat. Both evaporator boats were formed of tungsten. The system was evacuated to a pressure of less than $1 \times 10^{-5}$ torr. The thermal evaporator boat containing $SnCl_2$ was electrically heated to yield a deposition rate of $SnCl_2$ in the range of 0.1 nm/sec to 10 nm/sec, such as 1 nm/sec. The deposition of the $SnCl_2$-containing layer was continued to a thickness in the range of 100 nm to 1,500 nm, such as 300 nm. After the desired thickness was obtained, the electrical current to the thermal evaporator boat containing $SnCl_2$ was turned off, and electrical current was applied to the thermal evaporator boat containing CsI. CsI has a lower vapor pressure than $SnCl_2$, and, accordingly, a greater amount of electrical current was applied to yield a deposition rate of CsI in the range of 0.1 nm/sec to 10 nm/sec, such as 1 nm/sec. The thickness of the CsI-containing layer was in the range of 100 nm to 1,500 nm, such as 300 nm. The thickness ratio of $SnCl_2$ to CsI was varied in the range of 0.1 to 10. After the deposition of the layers of $SnCl_2$ and CsI was complete, the system was vented to atmospheric conditions. The resulting materials were observed to emit light in the range of 900 nm to 1 µm, such as with a peak emission wavelength of about 930 nm or about 950 nm. In some cases, the intensity of emitted light was enhanced by annealing, such as by heating in a nitrogen purged oven for 2 minutes to 1 hour at a temperature in the range of 120° C. to 350° C. A typical annealing process involved a ramp rate of 30° C./min to 210° C. for 10 minutes and a cool down at a ramp rate of 20° C./min.

Example 22

Formation and Characterization of Luminescent Material

A luminescent material was prepared using a vacuum deposition system. Reagent grade $SnBr_2$ was placed in a first bell jar thermal evaporator boat, and reagent grade CsBr was placed in a second thermal evaporator boat. Processing conditions were similar to those described in Example 21. The resulting material was observed to emit light in the range of 700 n to 800 nm, such as with a peak emission wavelength of about 700 nm.

Example 23

Formation and Characterization of Luminescent Material

Luminescent materials were prepared using a vacuum deposition system. Reagent grade $SnBr_2$ was placed in a first bell jar thermal evaporator boat, and reagent grade CsI was placed in a second thermal evaporator boat. $SnBr_2$ and CsI were then sequentially evaporated and deposited on a substrate. The deposited layers of $SnBr_2$ and CsI were subjected to annealing for less than 20 minutes at a temperature of less than 200° C. The resulting materials were observed to emit light with a peak emission wavelength of about 700 nm. Higher annealing temperatures and longer annealing times were observed to yield materials with a peak emission wavelength of about 930 nm.

Example 24

Formation of Luminescent Material

A luminescent material was prepared using a vacuum deposition system. Reagent grade $SnCl_2$ and reagent grade CsI were mixed, and then placed in a single bell jar thermal evaporator boat. The mixture of $SnCl_2$ and CsI was then co-evaporated and co-deposited on a substrate to yield the luminescent material.

Example 25

Formation of Luminescent Material

A luminescent material was prepared using a vacuum deposition system. Reagent grade $SnCl_2$ and reagent grade CsI were mixed, and then pre-melted at a temperature greater than 210° C. The pre-melted mixture was evaporated and deposited on a substrate to yield the luminescent material.

Example 26

Formation and Characterization of Luminescent Material

A luminescent material was prepared by evaporating and depositing $SnCl_2$ and CsI. The deposition of $SnCl_2$ and CsI was carried out with a flow of $O_2$ gas. The flow rate of $O_2$ gas was varied from 10 standard cubic centimeters per minute ("sccm") to 200 sccm. The use of $O_2$ gas during deposition was observed to enhance the intensity and stability of the resulting photoluminescence.

Example 27

Formation and Characterization of Luminescent Material

Luminescent materials were prepared by evaporating and depositing $SnCl_2$ and CsI. The deposition of $SnCl_2$ and the CsI was carried out with a flow of $O_2$ gas, and then a layer of tin metal was deposited with the flow of $O_2$ gas continuing. The thickness of the tin metal-containing layer was in the range of 10 nm to 250 nm. The deposited layers were then annealed in a nitrogen atmosphere at a temperature in the range of 150° to 300° for 2 minutes to 1 hour. The initially metallic film became transparent or semi-transparent with various colors ranging from gold to blue to silver. The tin metal deposition was observed to enhance the intensity and stability of the resulting photoluminescence. Other materials can be deposited in place of, or in conjunction with, the tin metal, such as $TiO_2$, $SnO_2$, $Ta_2O_5$, $BaTiO_3$, Pd, Ag, Au, Cu, Sn, SiN, $SiO_xN_y$, MgO, BaSi, semiconductors, polymers, and materials used for coating and encapsulation.

Example 28

Formation of Luminescent Material

A luminescent material was prepared by evaporating and depositing $SnCl_2$ and CsI. The deposition of $SnCl_2$ and the CsI was carried out without a flow of $O_2$ gas, and then a layer of tin metal was deposited with a flow of $O_2$ gas.

Example 29

Formation of Luminescent Material

Luminescent materials were prepared using a vacuum deposition system including a thermal evaporator boat (tungsten with or without $Al_2O_3$ overcoat) and an electron-beam evaporator boat (graphite crucible). Reagent grade $SnCl_2$ (0.25 g to 2.5 g) was placed in the thermal evaporator boat, and reagent grade CsI (0.25 g to 2.5 g) was placed in the graphite crucible for electron-beam deposition. The mass ratio of $SnCl_2$ and CsI was varied in the range of 0.1 to 10. $SnCl_2$ was used as a powder or a pre-melt. The pre-melt was prepared by processing $SnCl_2$ powder at a temperature in the range of 240° C. to 260° C. for 10 minutes in a nitrogen atmosphere. CsI was used as a powder or as 1 $cm^2$ pellets. The pellets were prepared with a pressure in the range of $2 \times 10^8$ Pa to $3 \times 10^8$ Pa using a hydraulic press. The system was evacuated to a pressure between $5 \times 10^{-6}$ torr to $5 \times 10^{-4}$ torr, such as less than $2 \times 10^{-5}$ torr. Thermal evaporation was first carried out using an electrical current in the range of 5 A to 6 A, such as 5.5 A. Next, electron-beam deposition was carried out using an electrical current in the range of 0.5 mA to 10 mA, such as 1 mA. A high voltage setting for electron-beam deposition was in the range of 4.5 kV to 5.5 kV, such as 5.25 kV. Electron-beam sweep control was also used. A resulting rate of deposition was 0.2 nm/sec to 2 nm/sec for $SnCl_2$ and 0.5 nm/sec to 3 nm/sec for CsI. When the deposition was complete, the system was vented with air or nitrogen, and the resulting materials were left inside the system for another 10 minutes to 15 minutes. A total thickness of 500 nm to 2,000 nm was measured using a profiling system.

Example 30

Formation of Luminescent Material

Luminescent materials were prepared using a vacuum deposition system. The thickness of a $SnCl_2$-containing layer was in the range of 20 nm to 1,000 nm, and the thickness of a CsI-containing layer was in the range of 50 nm to 1,000 nm. The thickness ratio of $SnCl_2$ to CsI was varied in the range of 0.02 to 20. Processing conditions were similar to those described in Example 29.

Example 31

Formation of Luminescent Material

Processing conditions similar to those described in Example 29 were used to form layers of $SnCl_2$ and CsI. Next, Al$_2$O$_3$ powder was placed in a graphite crucible, and then pre-melted using an electron-beam sweep with an electrical current in the range of 35 mA to 45 mA. This process was carried out for 10 minutes to 15 minutes. Then, an Al$_2$O$_3$ overcoat was deposited on the layers of SnCl$_2$ and CsI using electron-beam deposition. The electron-beam deposition was carried out with an electrical current in the range of 30 mA to 40 mA and a high voltage setting of 5.25 kV, which produced a deposition rate of 0.05 nm/sec to 0.15 nm/sec. A total thickness of 50 nm to 200 nm was obtained. The Al$_2$O$_3$ overcoat serves to enhance the intensity and stability of the resulting photoluminescence.

Example 32

Formation of Luminescent Material

Processing conditions similar to those described in Example 29 were used to form layers of SnCl$_2$ and CsI. Next, SiO$_2$ crystalline chunks were placed in a graphite crucible, and SiO$_2$ was then deposited using electron-beam deposition. The electron-beam deposition was carried out with an electrical current in the range of 8 mA to 12 mA and a high voltage setting of 5.25 kV, which produced a deposition rate of 0.5 nm/sec to 0.8 nm/sec. A total thickness of 50 nm to 200 nm was obtained. The SiO$_2$ overcoat serves to enhance the intensity and stability of the resulting photoluminescence. Other materials can be deposited in place of, or in conjunction with, SiO$_2$, such as TiO$_2$, SnO$_2$, Ta$_2$O$_5$, BaTiO$_3$, Pd, Ag, Au, Cu, Sn, SiN, SiO$_i$N$_j$, MgO, BaSi, semiconductors, polymers, and materials used for coating and encapsulation.

Example 33

Formation of Luminescent Material

Processing conditions similar to those described in Example 29 are used, but with the order of deposition of SnCl$_2$ and CsI reversed.

Example 34

Formation of Luminescent Material

Processing conditions similar to those described in Example 29 are used, but with multiple deposited layers of SnCl$_2$, multiple deposited layers of CsI, or both. A typical time period between depositing each layer is from 1 minute to 2 minutes.

Example 35

Formation of Luminescent Material

Processing conditions similar to those described in Example 29 are used, but with SnCl$_2$ and CsI being co-deposited. A typical time period between depositing each layer is from 1 minute to 2 minutes.

Example 36

Formation of Luminescent Material

Processing conditions similar to those described in Example 29 are used. After the deposition of SnCl$_2$ and CsI is complete, the resulting material is subjected to annealing by beating in a nitrogen purged oven for 5 minutes to 2 hours at a temperature in the range of 150° C. to 350° C. A typical annealing process involves a ramp rate of 5° C./min to 50° C./min.

Example 37

Formation of Luminescent Material

Luminescent materials are formed on various substrates using processing conditions similar to those described in Example 29. Examples of the substrates include silicon wafers, germanium wafers, GaAs wafers, and substrates formed of borosilicate glass, micro-roughened glass, silica, polycrystalline Al$_2$O$_3$, MgO, SrTiO, indium tin oxide ("ITO"), sapphire, and LiF$_2$. The substrates have dimensions of 25 mm×25 mm or 25 mm×75 mm.

Example 38

Formation of Luminescent Material

Processing conditions similar to those described in Example 31 are used, but with multiple overcoat layers of Al$_2$O$_3$. A typical time period between depositing each overcoat layer is from 1 minute to 2 minutes.

Example 39

Formation of Luminescent Material

Processing conditions similar to those described in Example 32 are used, but with multiple overcoat layers of SiO$_2$. A typical time period between depositing each overcoat layer is from 1 minute to 2 minutes.

Example 40

Characterization of Luminescent Material

Figure 8:
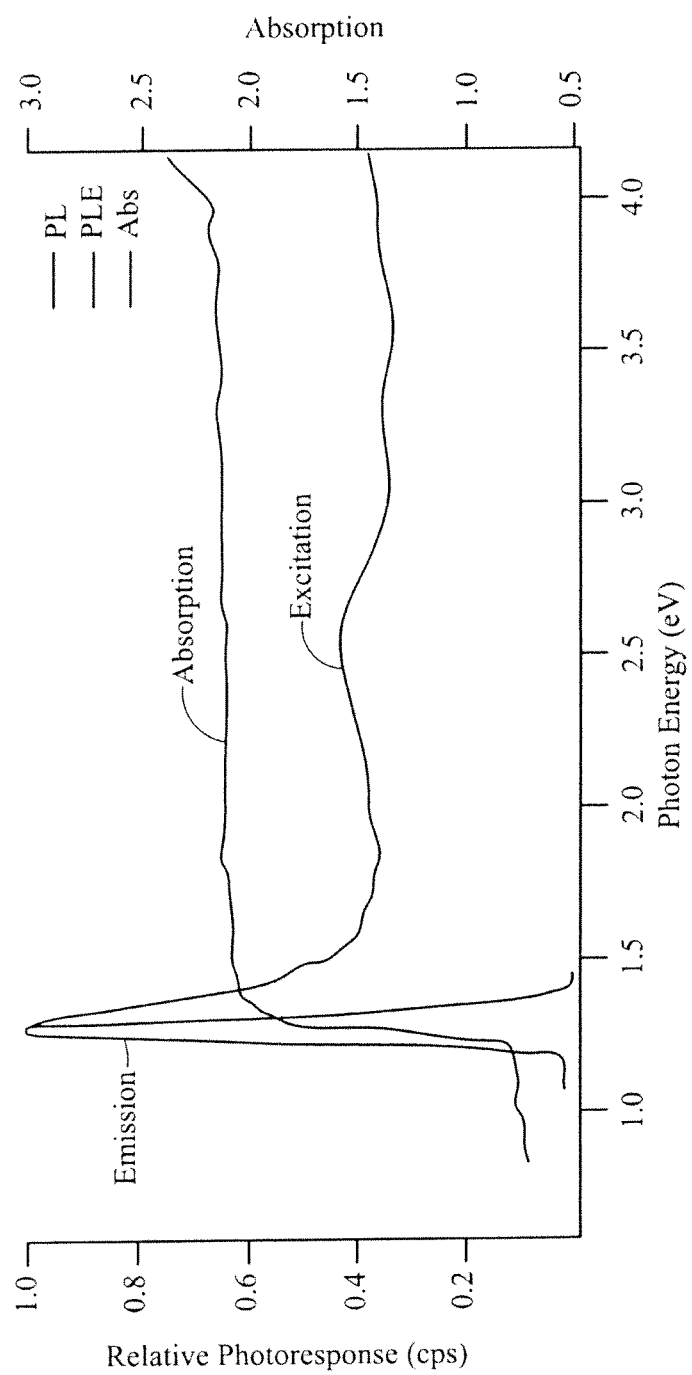
FIG. 8 illustrates spectra of a luminescent material, according to an embodiment of the invention.

A luminescent material including cesium, tin, and iodine was prepared, and optical characteristics of the luminescent material were measured in accordance with standard techniques. FIG. 8 illustrates an emission spectrum and an excitation spectrum that were obtained for a range of photon energies expressed in electron volts ("eV"). As can be appreciated with reference to FIG. 8, the luminescent material emitted light with high intensities, with a narrow spectral width of less than about 50 meV at FWHM, and with a peak emission wavelength of about 930 nm. Also, these photoluminescent characteristics were relatively insensitive to changes in excitation wavelength from the ultraviolet range to the emission band. These photoluminescent characteristics are unlike those of a standard CsI doped with tin, which typically emits light with shorter wavelengths, such as in the blue region or in the ultraviolet range. Absorption characteristics of the luminescent material were also measured in accordance with standard techniques. In particular, an absorption spectrum of the luminescent material was obtained and is superimposed onto the spectra illustrated in FIG. 8. As can be appreciated with reference to FIG. 8, the emission band of the luminescent material is located at or near the absorption band edge.

Example 41

Characterization of Luminescent Material

Figure 9:
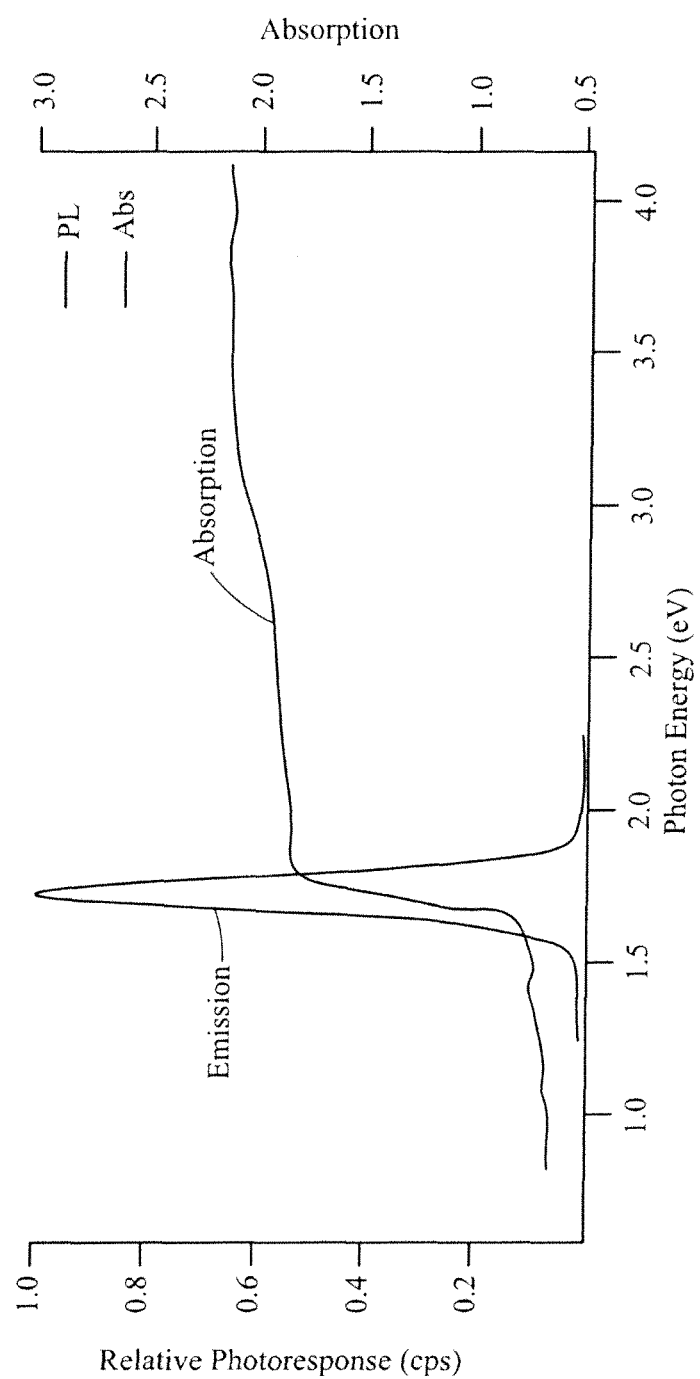
FIG. 9 illustrates spectra of another luminescent material, according to an embodiment of the invention.

A luminescent material including cesium, tin, and bromine was prepared, and optical characteristics of the luminescent material were measured in accordance with standard techniques. FIG. 9 illustrates an emission spectrum that was obtained for a range of photon energies. As can be appreciated with reference to FIG. 9, the luminescent material emitted light with high intensities, with a narrow spectral width, and with a peak emission wavelength of about 700 nm. These photoluminescent characteristics are unlike those of a standard CsBr doped with tin, which typically emits light with shorter wavelengths, such as in the blue region or in the ultraviolet range. Absorption characteristics of the luminescent material were also measured in accordance with standard techniques. In particular, an absorption spectrum of the luminescent material was obtained and is superimposed onto the spectrum illustrated in FIG. 9. As can be appreciated with reference to FIG. 9, the emission band of the luminescent material is located at or near the absorption band edge.

Example 42

Characterization of Luminescent Material

Figure 10:
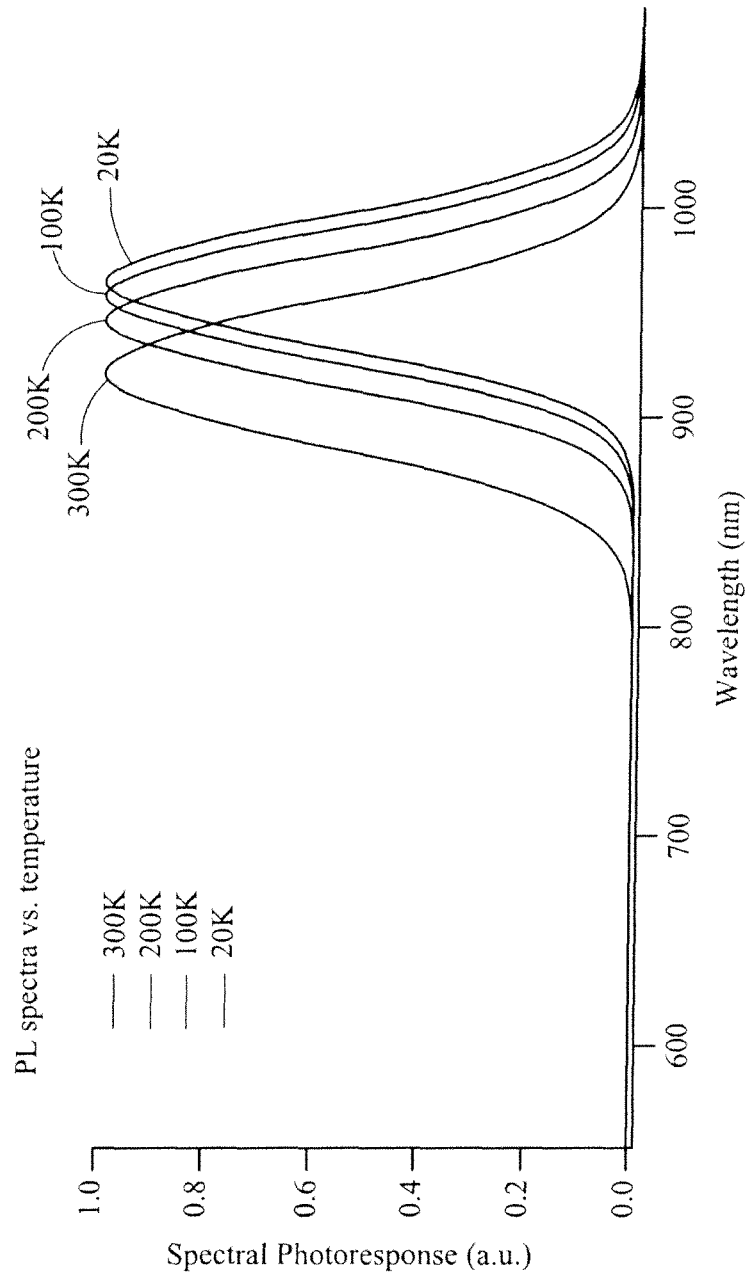
FIG. 10 illustrates emission spectra of a luminescent material for a range of temperatures, according to an embodiment of the invention.

A luminescent material including cesium, tin, and iodine was prepared, and optical characteristics of the luminescent material were measured at different temperatures. FIG. 10 illustrates emission spectra that were obtained for a range of temperatures. As can be appreciated with reference to FIG. 10, a peak emission wavelength of the luminescent material decreased with increasing temperature. This variation of the peak emission wavelength with temperature is unlike that of many standard materials, which typically have a peak emission wavelength that increases with increasing temperature.

Example 43

Characterization of Luminescent Material

Figure 11:
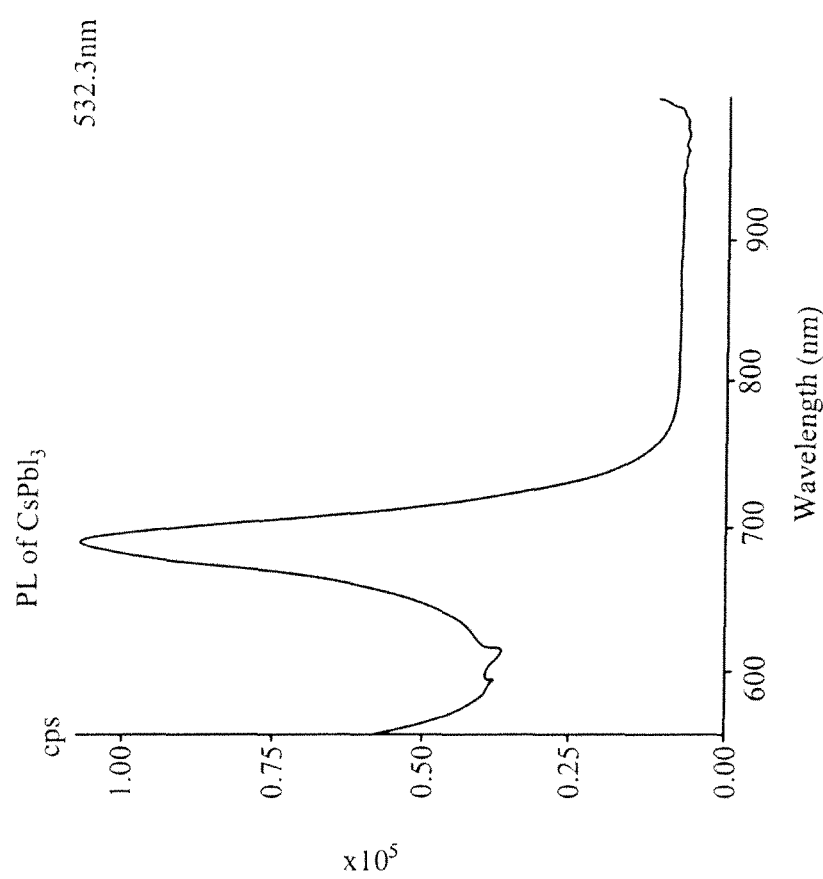
FIG. 11 illustrates an emission spectrum of a luminescent material including cesium, lead(II), and iodine, according to an embodiment of the invention.

A luminescent material including cesium, lead(II), and iodine ($CsPbI_3$) was prepared, and optical characteristics of the luminescent material were measured in accordance with standard techniques. FIG. 11 illustrates an emission spectrum that was obtained for a range of wavelengths. As can be appreciated with reference to FIG. 11, the luminescent material emitted light with high intensities, with a narrow spectral width, and with a peak emission wavelength of about 700 nm.

Example 44

Characterization of Luminescent Material

Figure 12:
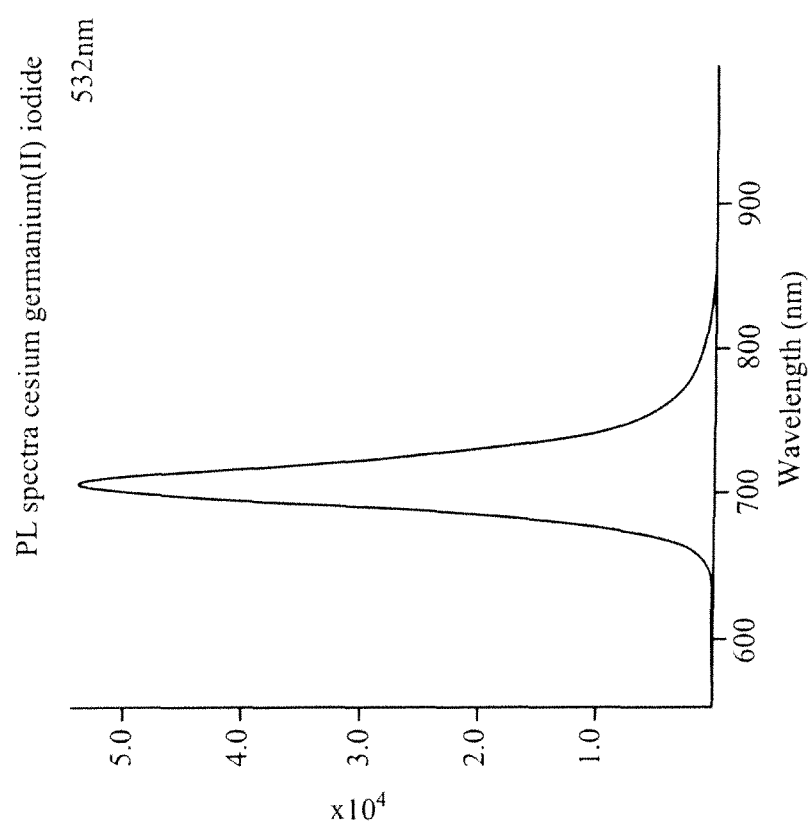
FIG. 12 illustrates an emission spectrum of a luminescent material including cesium, germanium(II), and iodine, according to an embodiment of the invention.

A luminescent material including cesium, germanium(II), and iodine was prepared, and optical characteristics of the luminescent material were measured in accordance with standard techniques. FIG. 12 illustrates an emission spectrum that was obtained for a range of wavelengths. As can be appreciated with reference to FIG. 12, the luminescent material emitted light with high intensities, with a narrow spectral width, and with a peak emission wavelength of about 700 nm.

Example 45

Characterization of Luminescent Material

Figure 13:
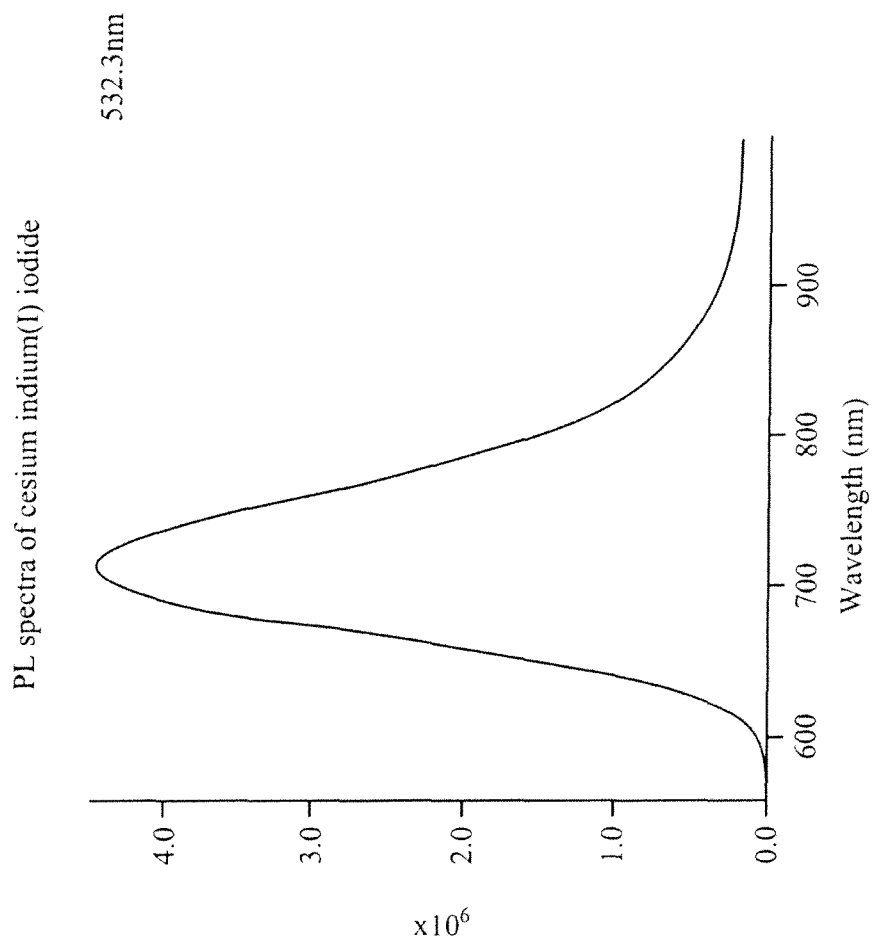
FIG. 13 illustrates an emission spectrum of a luminescent material including cesium, indium(I), and iodine, according to an embodiment of the invention.

A luminescent material with B being a non-Group 14 element was sometimes observed to have a greater spectral width. In particular, the luminescent material including cesium, indium(I), and iodine was prepared, and optical characteristics of the luminescent material were measured in accordance with standard techniques. FIG. 13 illustrates an emission spectrum that was obtained for a range of wavelengths. As can be appreciated with reference to FIG. 13, the luminescent material emitted light with a spectral width that was greater than 100 meV. An excitation spectrum (not illustrated in FIG. 13) was observed to include a set of narrow bands within a range of excitation wavelengths.

Example 46

Formation and Characterization of Luminescent Material

Figure 14:
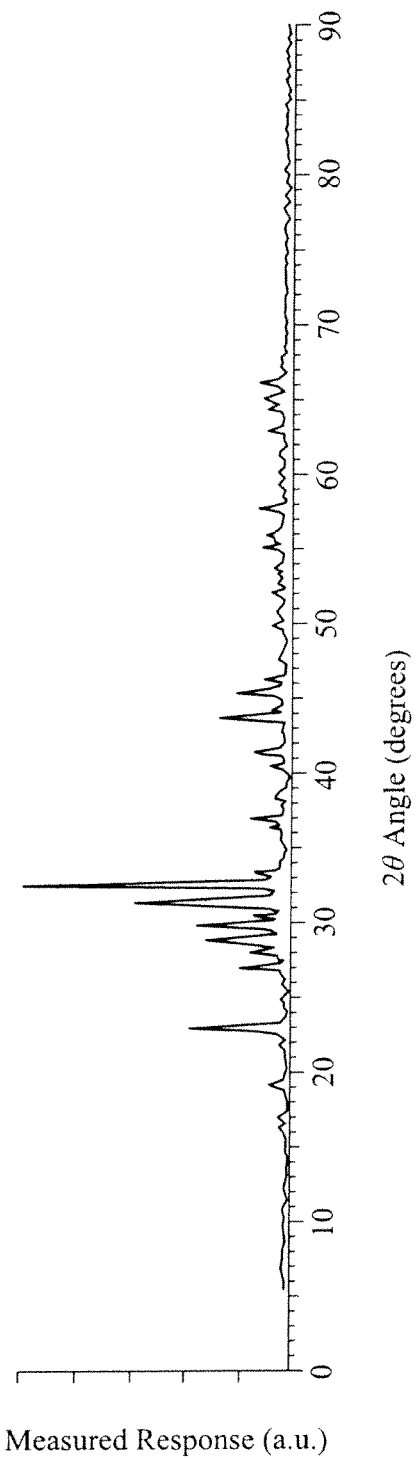
FIG. 14 illustrates a X-ray Diffraction ("XRD") pattern of a luminescent material, according to an embodiment of the invention.
Figure 15A:
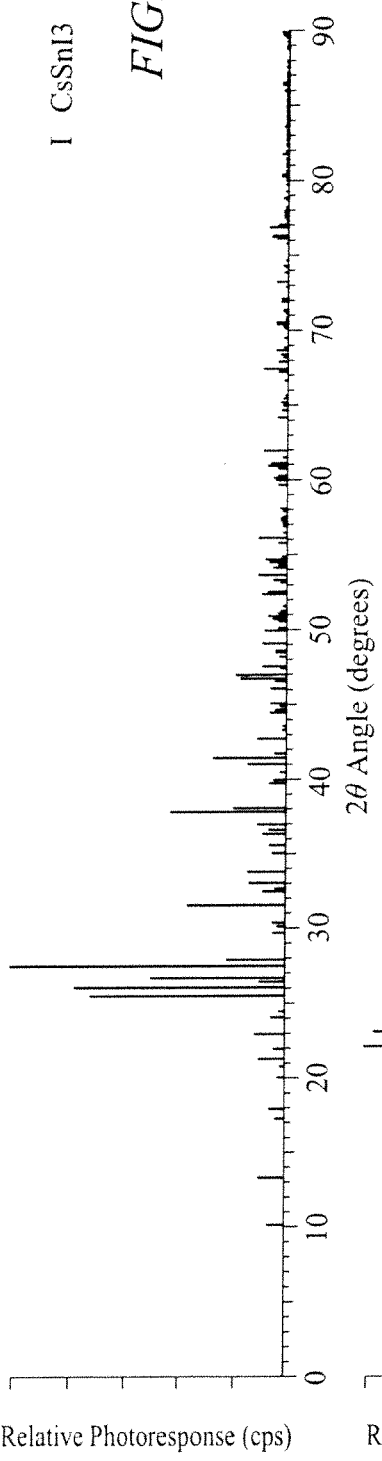
FIG. 15A through FIG. 15C illustrate XRD patterns of various standard materials.
Figure 15B:
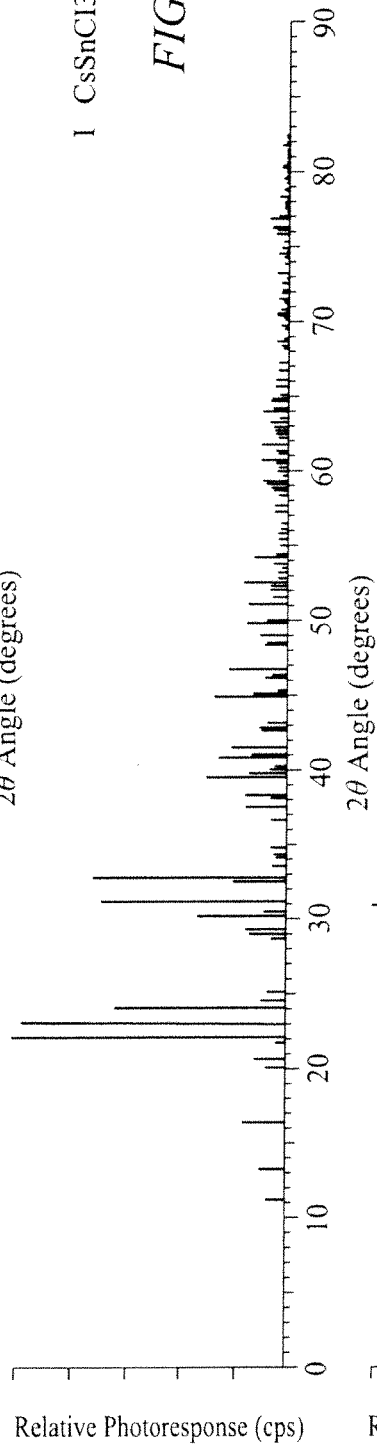
Figure 15C:
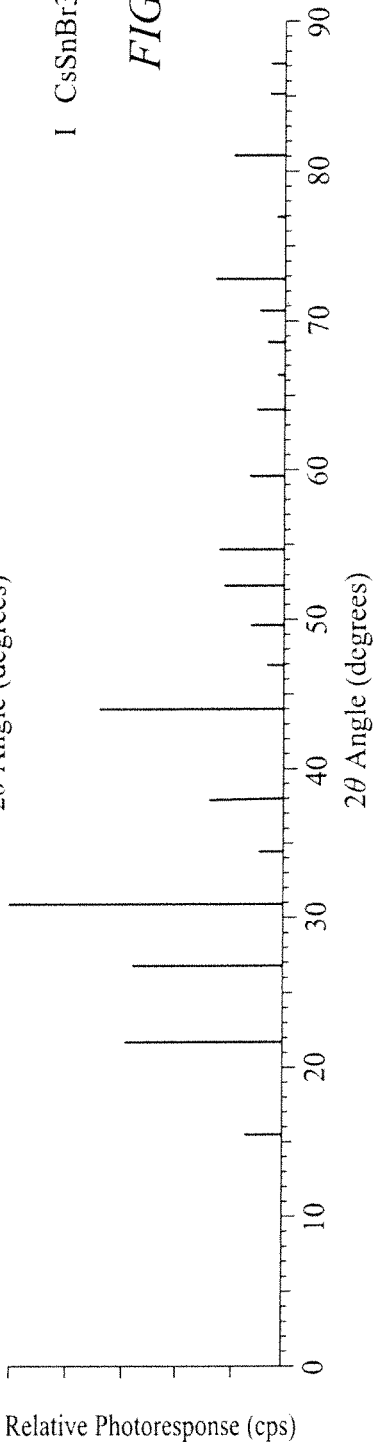

Processing conditions similar to those described in Example 21 were used to prepare a luminescent material including cesium, tin, and iodine, and the luminescent material was characterized in accordance with standard X-ray Diffraction ("XRD") techniques. FIG. 14 illustrates a XRD pattern that was obtained for the luminescent material. The XRD pattern of the luminescent material was compared with XRD patterns of various standard materials, including a standard $CsSnI_3$ (illustrated in FIG. 15A), a standard $CsSnCl_3$ (illustrated in FIG. 15B), and a standard $CsSnBr_3$ (illustrated in FIG. 15C), and did not produce a match. Differences in the XRD patterns indicate that the luminescent material has a different microstructure relative to the standard materials.

The luminescent material was also characterized using a microscope. The luminescent material was observed to emit light in the near infrared range, and appeared crystalline under the microscope. When illuminated with 633 nm laser light, the luminescent material appeared bright when viewed with an infrared camera sensitive to wavelengths in the range of 850 nm to 1,000 nm.

It should be recognized that the embodiments of the invention described above are provided by way of example, and various other embodiments are encompassed by the invention. For example, while some embodiments of the invention have been described with reference to anti-counterfeiting and inventory applications, it is contemplated that the luminescent materials described herein can be used for a variety of other applications. In particular, it is contemplated that the luminescent materials can have band gap energies, electrical conductivities, and other characteristics that render the luminescent materials desirable for a variety of optoelectronic applications, such as those related to photovoltaic devices, photoconductors, photodetectors, light-emitting diodes, lasers, and other devices that involve photons and charge carriers during their operation.

For example, luminescent materials described herein can be advantageously used in photovoltaic devices as a solar down conversion material. In particular, the luminescent materials can absorb a wide range of solar wavelengths and convert the absorbed solar radiation into a peak emission wavelength. This peak emission wavelength can have an energy matched with (e.g., at or near) a band gap of a semiconductor material, such as silicon, within the photovoltaic devices. This down conversion process can increase a theoretical efficiency of a silicon photovoltaic device from 31 percent to 41 percent. Further enhancements in efficiency can occur with the use of solar down conversion concentrators, where the absorbed solar radiation from a large area is concentrated onto a small area of the semiconductor material.

A practitioner of ordinary skill in the art requires no additional explanation in developing the embodiments described herein but may nevertheless find some helpful guidance by examining the patent application of Midgley et al., U.S. Provisional Application Ser. No. 60/716,656, entitled "Authenticating and Identifying Objects Using Nanoparticles" and filed on Sep. 12, 2005, the disclosure of which is incorporated herein by reference in its entirety.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A method of forming a luminescent material, comprising:
    providing a first compound having the formula: AX, wherein A is cesium, and X is iodine;
    providing a second compound of B and Y, wherein B is tin, and Y is selected from at least one of oxygen, fluorine, chlorine, bromine, nitrate, thiocyanate, hypochlorite, sulfate, orthophosphate, metaphosphate, oxalate, methanesulfonate, trifluoromethanesulfonate, and pyrophosphate;
    depositing the first compound and the second compound on a substrate to form at least one film on the substrate; and
    heating the at least one film to a temperature sufficient to react the first compound and the second compound to form a luminescent material,
    wherein the luminescent material has the formula: $[A_aB_bX_x][dopants]$, wherein a is 1, b is in the range of 1 to 3, x is in the range of 3 to 7, and the dopants are derived from Y and are included in a non-zero amount less than 5 percent in terms of elemental composition.

2. The method of claim 1, wherein depositing the first compound and the second compound includes sequentially depositing the first compound and the second compound on the substrate.

3. The method of claim 1, wherein depositing the first compound and the second compound includes co-depositing the first compound and the second compound on the substrate.

4. The method of claim 1, wherein depositing the first compound and the second compound includes:
    forming multiple, first films including the first compound; and
    forming multiple, second films including the second compound,
    wherein the first films are interspersed with respect to the second films.

5. The method of claim 1, wherein heating the at least one film is carried out to a temperature in the range of 120° C. to 350° C. and for a time period in the range of 2 minutes to 1 hour.

6. The method of claim 1, further comprising:
    depositing an encapsulation material on the at least one film to form an overcoat layer on the at least one film, wherein the encapsulation material includes at least one of $Al_2O_3$, $TiO_2$, $SiO_2$, $SnO_2$, $Ta_2O_5$, $BaTiO_3$, MgO, Pd, Ag, Au, Cu, Sn, SiN, silicon oxynitride, and BaSi.

7. The method of claim 1, wherein b is 1.

8. The method of claim 1, wherein b is 2.

9. The method of claim 1, wherein Y is oxygen.

10. The method of claim 1, wherein Y is selected from nitrate, thiocyanate, hypochlorite, sulfate, orthophosphate, metaphosphate, oxalate, methanesulfonate, trifluoromethanesulfonate, and pyrophosphate.

* * * * *